United States Patent [19]
Levine

[11] Patent Number: 6,028,541
[45] Date of Patent: Feb. 22, 2000

[54] LOSSLESS DATA COMPRESSION WITH LOW COMPLEXITY

[75] Inventor: Earl Levine, Palo Alto, Calif.

[73] Assignee: Liquid Audio Inc., Redwood City, Calif.

[21] Appl. No.: 09/041,852

[22] Filed: Mar. 12, 1998

[51] Int. Cl.[7] .................................................. H03M 3/00
[52] U.S. Cl. .............................................. 341/76; 341/50
[58] Field of Search ................................. 341/64, 65, 76, 341/50

[56] References Cited

U.S. PATENT DOCUMENTS

| | | | |
|---|---|---|---|
| 5,414,796 | 5/1995 | Jacobs et al. | 395/2.3 |
| 5,418,713 | 5/1995 | Allen | 364/403 |
| 5,434,948 | 7/1995 | Holt et al. | 395/2.29 |
| 5,680,129 | 10/1997 | Weinberger et al. | 341/65 |
| 5,734,823 | 3/1998 | Saigh et al. | 395/200.06 |
| 5,734,891 | 3/1998 | Saigh | 395/610 |
| 5,794,217 | 8/1998 | Allen | 705/27 |
| 5,819,215 | 10/1998 | Dobson et al. | 704/230 |
| 5,835,034 | 11/1998 | Seroussi et al. | 341/65 |
| 5,884,269 | 3/1999 | Cellier et al. | 341/64 |

OTHER PUBLICATIONS

Weinberger, et al., "LOCO–I: A Low Complexity, Context–Based, Lossless Image Compression Algorithm," IEEE Computer Society Press, Mar. 31–Apr. 3, 1996, pp. 140–149.

Primary Examiner—Brian Young
Attorney, Agent, or Firm—James D. Ivey

[57] ABSTRACT

An adaptive linear predictor is used to predict samples, and residuals from such predictions are encoded using Golomb-Rice encoding. Linear prediction of samples of a signal which represents digitized sound tends to produce relatively low residuals and those residuals tend to be distributed exponentially. Accordingly, linear prediction combined with Golomb-Rice encoding produces particularly good compression rates with very efficient and simple implementation. A code length used in Golomb-Rice, which is typically referred to as the parameter k, is adapted for each sample in a predictable and repeatable manner to further reduce the size of a Golomb-Rice encoding for each sample. An infinite incident response filter of processed residuals automatically reduces influences of previously processed residuals upon such adaptation as additional samples are processed. In addition, the influence of each residual processed in the adaptation of the code length is directly related to the recency of the processing of the sample to which the residual corresponds. Furthermore, no resetting of the code length adaptation mechanism is required since influence of particularly distant residuals upon the adaptation of the code length diminishes to negligible amounts over time. The efficiency of Golomb-Rice encoding is improved by limiting the predicted samples to an efficient range. The maximum of the efficient range is the maximum valid value of a sample less the maximum positive value of the fixed-length, binary portion of an encoded residual. The adaptive predictor adapts to residuals between actual and predicted samples at a particular rate.

21 Claims, 14 Drawing Sheets

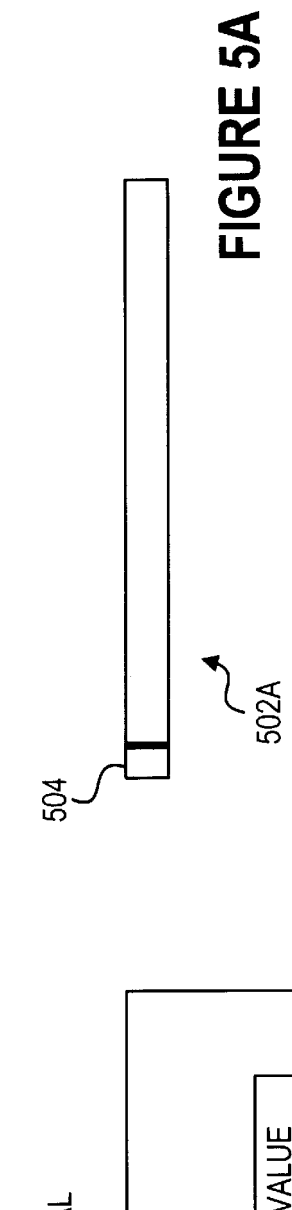
FIGURE 5A
FIGURE 5B
FIGURE 5C
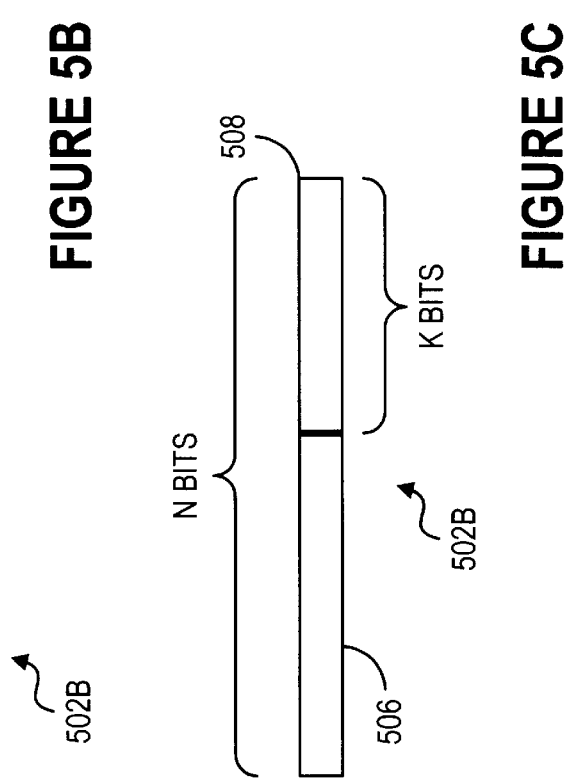
FIGURE 3

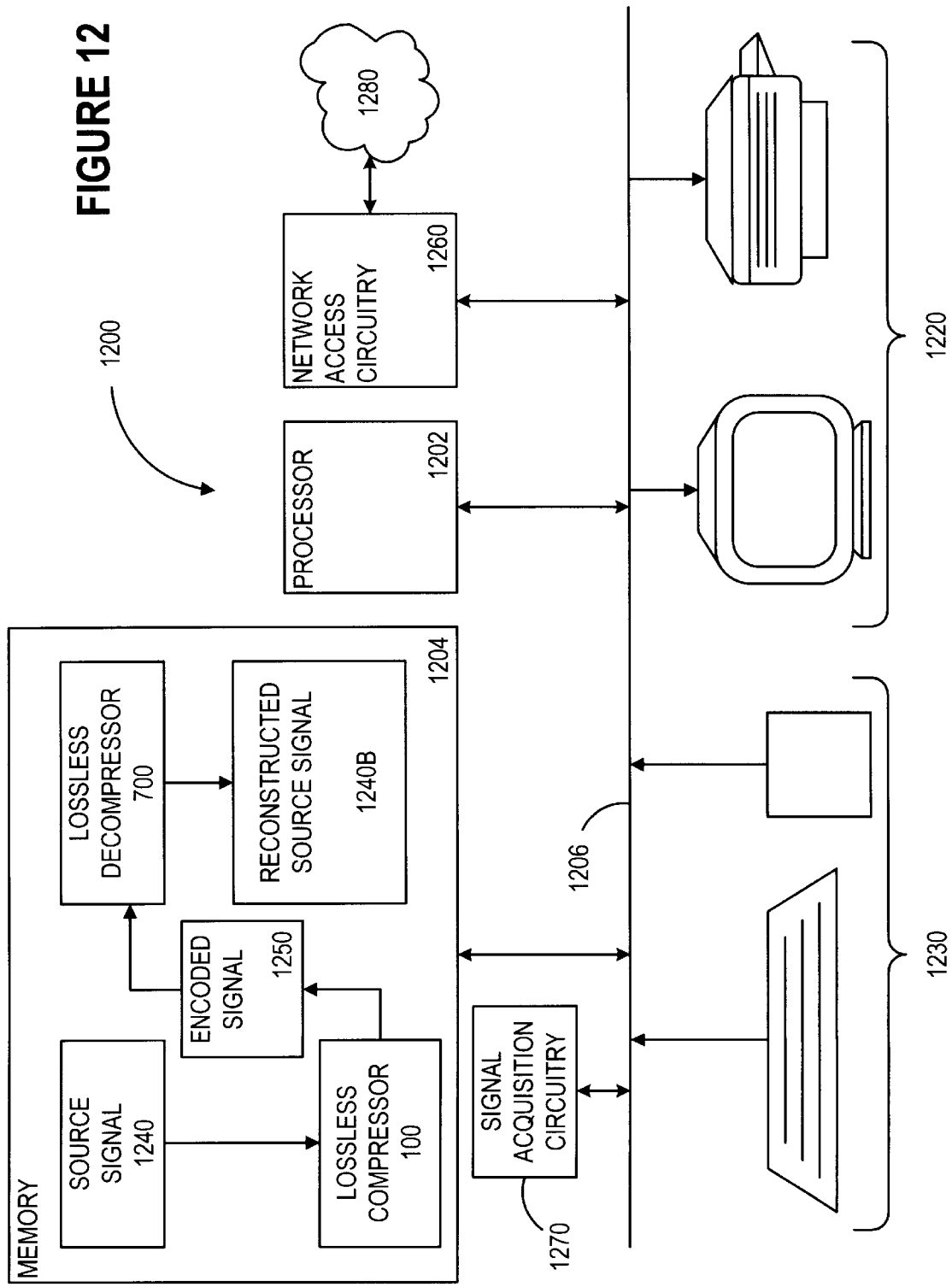

LOSSLESS DATA COMPRESSION WITH LOW COMPLEXITY

FIELD OF THE INVENTION

The present invention relates to data compression and, in particular, to a particularly efficient and computationally simple lossless data compression mechanism which achieves particularly good compression rates for digitized audio signals.

BACKGROUND OF THE INVENTION

Data compression has held a prominent place in computer science for many years as demand for additional data capacity of various systems increase while storage capacity and bandwidth of such systems are limited. Data compression generally falls into one of two categories: lossy and lossless. In lossy data compression, particularly high rates of data compression are achieved at the expense of distortion of the data. Such is sometimes acceptable for image, video and audio data since small distortions may be only slightly perceptible by a human viewer or listener of the subsequently decompressed data. However, in a number of applications, such distortion of the compressed data is unacceptable.

Lossless data compression reduces the size of the overall representation of data without any distortion of the data at all, i.e., without any loss of data. Lossless data compression is used primarily for compression of text, computer programs, and databases where faithful reproduction of the compressed data is essential. However, as distribution of high-quality digitized audio signals through computer networks becomes more prevalent, lossless compression of digitized audio signals with good data compression rates grows in importance.

In general, data is compressed by recognizing patterns in the data and representing such patterns in compact forms in place of the data having the recognized patterns. The degree of compression realized by a particular lossless compression mechanism depends in large part upon the correlation between patterns recognized by the mechanism and patterns in the data to be compressed. Since the majority of currently available lossless data compression mechanisms are designed for compressing textual data, such mechanisms achieve relatively good results when compressing data having patterns typically found in textual data. However, such mechanisms generally fail to achieve results as good when compressing non-textual data, e.g., data representing digitized audio signals.

In addition, the rate of data compression of lossless data compression techniques is generally inversely related to the complexity of such techniques. In real time delivery of compressed data through a delivery medium having limited bandwidth, a relatively high rate of compression of the compressed data is essential and a minimum acceptable rate of data compression is limited by the limited bandwidth of the delivery medium. At the same time, the complexity of the manner in which the data is compressed must generally be minimized such that the delivered compressed data can be decompressed without exceeding the processing bandwidth of a receiving system. Improving the rate of compression realized by a lossless data compression mechanism without simultaneously increasing the complexity of the lossless data compression is particularly difficult.

What is needed is a system for performing lossless data compression in such a way that particularly good data compression rates are realized, particularly when compressing data representing digitized audio signals, while simultaneously maintain a particularly low level of complexity of such lossless data compression.

SUMMARY OF THE INVENTION

In accordance with the present invention, an adaptive linear predictor is used to predict samples, and residuals from such predictions are encoded using Golomb-Rice encoding. Golomb-Rice encoding is particularly efficient and simply implemented. However, unless residuals are minimized and have a generally exponential distribution, Golomb-Rice encoding has marginal performance, at best, in terms of compression rates. Linear prediction of samples of a signal which represents digitized sound tends to produce relatively low residuals and those residuals tend to be distributed exponentially. Accordingly, linear prediction combined with Golomb-Rice encoding produces particularly good compression rates with very efficient and simple implementation.

To further improve the compression rates achievable using Golomb-Rice encoding, a code length used in Golomb-Rice, which is typically referred to as the parameter k, is adapted for each sample in a predictable and repeatable manner to further reduce the size of a Golomb-Rice encoding for each sample. Some conventional adaptations of a code length use a straight average of a number of recent residuals to adapt the code length. Such systems suffer from the disadvantage that remote residuals, i.e., residuals of samples processed in the relatively distant past, have as much influence on the adaptation of the code length as do near residuals, i.e., residuals of samples processed in the relatively recent past. Some such systems require periodic resetting of the code length adaptation mechanism to eliminate undue influence upon the adaptation of the code length of residuals of samples processed to remotely.

In accordance with the present invention, an infinite incident response filter of processed residuals automatically reduces influences of previously processed residuals as additional samples are processed. In addition, the influence of each residual processed in the adaptation of the code length is directly related to the recency of the processing of the sample to which the residual corresponds. Furthermore, no resetting of the code length adaptation mechanism is required since influence of particularly distant residuals upon the adaptation of the code length diminishes to negligible amounts over time. In addition, the IIR filter is particularly simple to implement. For example, the weights of the previously filtered residual and the current residual can be $(2^j-1)/2^j$ and $\frac{1}{2^j}$, respectively, where j is an integer. Accordingly, the previously filtered residual can be weighted using integer arithmetic rather than floating point arithmetic to further expedite the processing of the lossless compressor according to the present invention. Specifically, the previously filtered residual is weighted by a bit-shift j places to the left from which the previously filtered residual is subtracted. The current residual is added to the result and the sum is bit-shifted j places to the right to effect division. Accordingly, four integer operations perform a single iteration of the IIR filter and, in addition, superior results are achieved.

Further in accordance with the present invention, the efficiency of Golomb-Rice encoding is improved by limiting the predicted samples to an efficient range. In general, the representation of a sample of a digital signal is effectively limited to the particular values that can be represented by such a representation. In encoding a residual according to the present invention, a least significant portion of the residual is represented in a fixed-length, binary form and a most significant portion is represented in a variable-length, unary form. The maximum of the efficient range of the predicted sample is chosen such that no possible value of the fixed-length, binary portion of an encoded residual can be added to the limited predicted sample to produce a value which is beyond the range of valid sample values. Specifically, the maximum of the efficient range is the maximum valid value of a sample less the maximum positive value of the fixed-length, binary portion of an encoded residual. Accordingly, bits are not wasted in the variable-length, unary portion to represent unduly large residuals. In addition, the full range of the fixed-length, binary portion is utilized. At the other end of the efficient range, the minimum is chosen such that no possible value of the fixed-length, binary portion of an encoded residual can be added to the limited predicted sample to produce a value beyond the range of valid samples. Specifically, the minimum of the efficient range is the minimum valid value plus the minimum negative value of the fixed-length, binary portion of an encoded residual.

As described briefly above, the lossless compressor according to the present invention includes an adaptive predictor. The adaptive predictor adapts to residuals between actual and predicted samples at a particular rate. Further performance improvements in the lossless compression of signals according to the present invention in terms of compression rates are realized by periodically adapting the adaptation rate. A portion of the signal including a number of samples is compressed using a particular adaptation rate. The adaptation rate is adjusted and the portion is compressed again using the adaptation rate as adjusted. The resulting compressed portions are compared to determine which adaptation rate produces the better results. The adjusting, compressing, and comparing process is repeated iteratively until the best adaptation rate is determined.

Adjusting the adaptation rate increments or decrements the adaptation rate. In addition, the adaptation rate specifies an exponent of an amount by which the predictor adapts to residuals such that unitary adjustments to the adaptation rate change the amount of adaptation of the predictor exponentially. In particular, the adaptation rate is an exponent of two (2) such that incrementing the adaptation rate effectively doubles the rate at which the predictor adapts according to residuals and decrementing the adaptation rate effectively halves the rate at which the predictor adapts according to residuals. In addition, adapting the predictor by integer factors of two (2) allows such adaptation to be accomplished using bit shifts to further simplify and expedite compression according to the present invention.

Further in accordance with the present invention, correlation between companion channels of a digital signal are used to improve the accuracy of sample prediction such that residuals, and therefore representations thereof, are minimized. For example, if a digital signal represents a left channel and a right channel of a stereo sound, corresponding samples of the left and right channels have a relatively high degree of correlation. Accordingly, a sample of the right channel is predicted using, in addition to previously processed samples of the right channel, a current sample of the left channel. Because of the relatively high degree of correlation, the accuracy with which the current right channel is predict is increased.

BRIEF DESCRIPTION OF THE DRAWINGS

FIG. 3 is a block diagram of a code length adapter of the predictor of FIG. 2.

FIG. 12 is a block diagram of a computer system within which the lossless compressor of FIG. 1 and the lossless decompressor of FIG. 7 execute.

DETAILED DESCRIPTION

Figure 1:
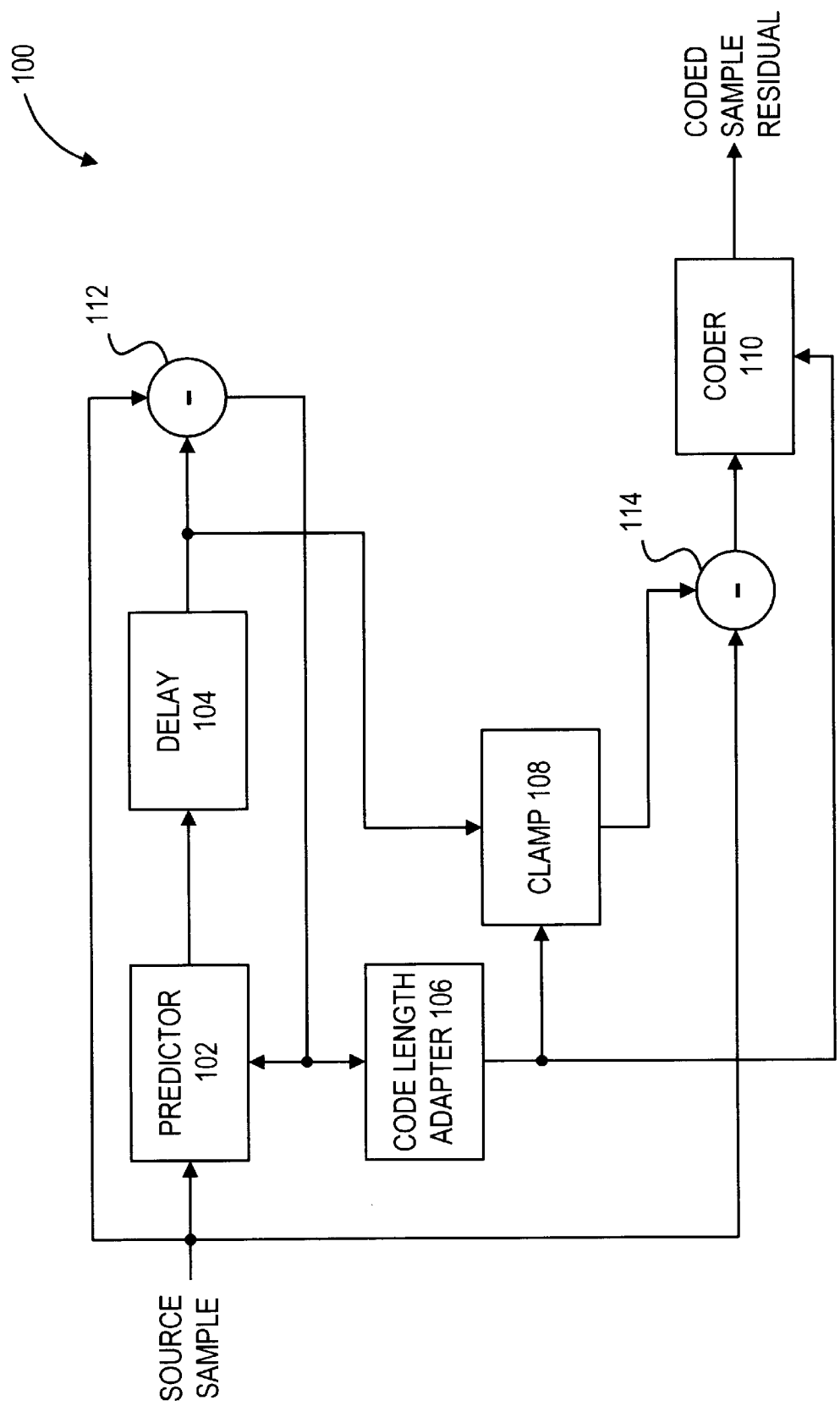
FIG. 1 is a block diagram of a lossless compressor in accordance with the present invention.

In accordance with the present invention, the simplicity of Golomb-Rice encoding is combined with a adaptive linear predictor to achieve particularly good compression rates for lossless compression of digitized audio signals while preserving the computational simplicity and commensurate processing speed of Golomb-Rice encoding. Specifically, a lossless compressor 100 (FIG. 1) includes a predictor 102 which uses a least-mean-square adaptive linear filter to predict a next sample from previous samples of a digital signal and further includes a coder 110 which encodes a residual, i.e., a difference between the predicted sample and the actual sample, using Golomb-Rice encoding. Golomb-Rice encoding is well-known but is described briefly below for completeness.

Predictor 102 receives a source sample of a digitized signal to be compressed and encoded by lossless compressor 100 and predicts therefrom a next sample in a manner described more completely below and forwards the predicted next sample to a delay 104. When the next source sample is received by lossless compressor 100, a subtracter 112 measures the difference between the next source sample received by lossless compressor 100 with the predicted next sample stored in delay 104. The measured difference is referred to herein a raw residual. The raw residual is a measure of error between the predicted next sample and the actual next sample and is therefore used by predictor 102 to adapt the nature of the prediction to more accurately predict future next samples. This adaptation is described more completely below.

In addition, lossless compressor 100 includes a code length adapter 106 which uses the raw residual to adapt a code length used by coder 110 in a manner described more completely below to more efficiently encode residual samples. The residual samples encoded by coder 110 are not the raw residual samples described above but are instead clamped residual samples received from subtracter 114. Clamped residual samples further improve the efficiency with which coder 110 encodes residual samples in a manner described more completely below.

It should be noted that efficiency of a Golomb-Rice encoder is maximized when the values being encoded have an exponential distribution. Predictor 102 is designed to produce raw residual samples which have a generally exponential distribution for source samples of a digitized audio signal and is shown in greater detail in FIG. 2. Predictor 102 includes a delay buffer 202 which stores a number of most recently received source samples and a number of corresponding predictor coefficients. Each of the most recently received source samples are weighted by a respective one of the predictor coefficients and accumulated to produce a predicted sample. Predictor 102 is therefore a linear filter. In addition, the predictor coefficients are selected so as to form a least mean square linear filter in one embodiment.

Figure 11:
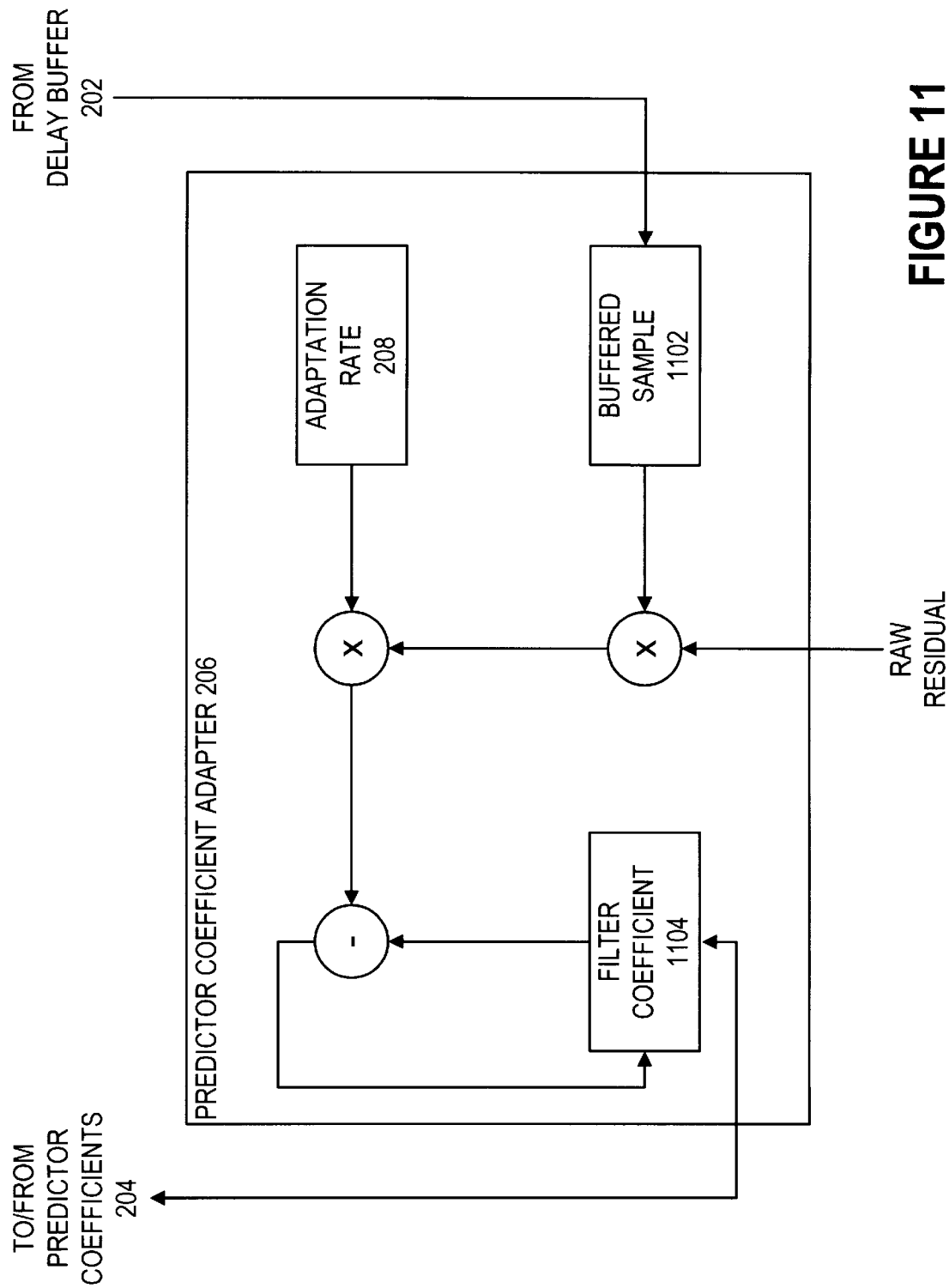
FIG. 11 is a block diagram of a predictor coefficient adapter of the predictor of FIG. 2.

Predictor coefficients 204 are adaptive in response to raw residual samples formed from previously predicted samples. Specifically, a predictor coefficient adapter 206 receives the raw residual sample from subtracter 112 (FIG. 1) and weights the raw residual sample with an adaptation rate 208 (FIG. 2) to produced a weighted error. Predictor coefficient adapter 206 decreases each of predictor coefficients 204 by the product of the corresponding source sample of delay buffer 202 and the weighted error to thereby adapt each of predictor coefficients 204 as shown in FIG. 11. To improve efficiency of predictor coefficient adapter 206 and to achieve additional advantages described more completely below, adaptation rate 208 is an integer power of 2. Accordingly, weighting of the raw residual sample with adaptation rate 208 can be implemented as a bit-wise shift of the raw residual sample or, alternatively, of the product of the raw residual sample and each of predictor coefficients 204. Adaptation rate 208 controls how aggressively predictor 102 (FIG. 2) compensates for large raw residual samples.

Figure 5:
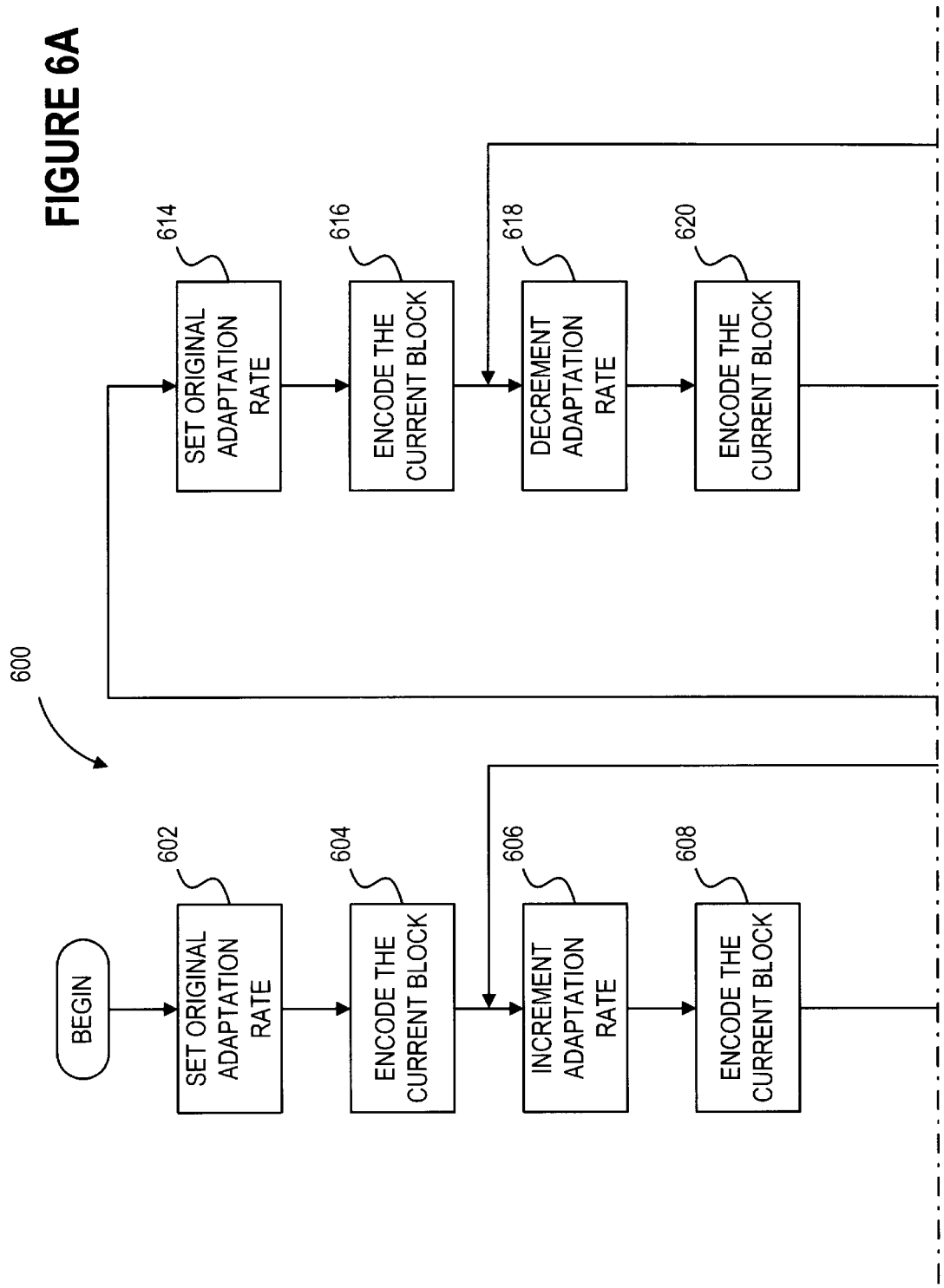
FIGS. 5A–C are block diagrams illustrating Golomb-Rice encoding.

While Golomb-Rice encoding is well-known, a brief discussion of Golomb-Rice encoding facilitates appreciation of various components of lossless compressor 100 (FIG. 1). FIG. 5A shows a data word 502A which includes a number of bits, n. For example, data word 502A has 16 bits in one embodiment, i.e., n is 16. Data word 502A includes a sign bit 504 which indicates whether the value represented by data word 502A is positive or negative. Golomb-Rice encoding generally requires that the encoded value is nonnegative. Therefore, coder 110 (FIG. 1) (i) retrieves and saves sign bit 504 (FIG. 5A), (ii) changes the sign of the numerical value represented by the remainder of data word 502A if sign bit 504 indicates data word 502A is negative, (iii) shifts data word 502A to the left one bit to form data word 502B (FIG. 5B), and (iv) stores sign bit 504 as the least significant bit of data word 502B. With sign bit 504 moved to the least significant position, data word 502B is nonnegative. In addition, the relative magnitude of data word 502A (FIG. 5A) is preserved in data word 502B (FIG. 5B) such that, if values represented by data word 502A have a generally two-sided, signed, exponential distribution, values represented by data word 502B (FIG. 5B) also have a generally one-sided, unsigned, exponential distribution. One way to conceptualize this conversion is to assume an implicit decimal point immediately prior to sign bit 504 as rotated such that a negative integer, j, is represented as |j|+½.

After decoding as described more completely below, the sign of data word 502A (FIG. 5A) is restored by (i) retrieving and saving sign bit 504 (FIG. 5B) from data word 502B, (ii) shifting data word 502B to the right by one bit to form data word 502A (FIG. 5A), (iii) and changing the sign of the numerical value represented by data word 502A if sign bit 504 (FIG. 5B) of data word 502B indicates a negative value.

In Golomb-Rice encoding, a least significant binary portion 508 (FIG. 5C) of data word 502B is represented as a binary number which includes a number of bits, k where k<n. In other words, least significant portion 508 is represented without modification. A most significant unary portion 506 of data word 502B is represented in unary form. As an example, consider the Golomb-Rice encoding of the following bit pattern: "0000 0000 0101 1101" in which k is equal to five (5). The five (5) least significant bits of least significant binary portion 508 are represented in binary form without modification, i.e., as "1 1101." The eleven (11) most significant bits of most significant unary portion 506, i.e., "0000 0000 010," have a value of two (2) and are represented in unary form. Specifically, a series of two (2) "1" bits indicates a value of two (2) and a "0" bit delimits the series of "1" bits.

Therefore, efficiency of Golomb-Rice encoding is maximized when the numerical value of most significant unary portion 506 is minimized. In other words, the amount of data required to represent most significant unary portion 506 is generally directly related to the numerical value of most significant unary portion 506. Two factors therefore particularly effect the efficiency of Golomb-Rice encoding. The first factor is the distribution of data values encoded using Golomb-Rice encoding. The second factor is the position of the boundary between least significant binary portion 508 and most significant unary portion 506.

With respect to the distribution of data values encoded using Golomb-Rice encoding, reasonably optimal results can be achieved when the distribution of data values encoded is generally exponential and the data values themselves are relatively minimal. In compressing a digitized audio signal, the samples of the digitized audio signal are typically related to one another as audio signals are typically continuous in frequency, amplitude, and phase. As a result, individual samples of a digitized audio signal can be relatively accurately predicted from a linear. filter applied to a number of recently preceding samples of the digitized audio signal. The accuracy with which such individual samples are predicted is enhanced by adapting the linear filter in accordance with residuals between predicted and actual samples in a manner described more completely below.

The position of the boundary between least significant binary portion 508 and most significant unary portion 506, i.e., the size of least significant binary portion 508, also affects the efficiency of Golomb-Rice encoding. If the size of least significant binary portion 508, i.e., k, is too small, the numerical value of most significant unary portion 506 will frequently be too large and the amount of data required to encode most significant unary portion 506 will be too large as a consequence. Conversely, if the size of least significant binary portion 508, i.e., k, is too large, then all k bits of least significant binary portion 508 will be used to encode numerical values which could have been encoded using fewer bits.

Code length adapter 106 (FIG. 1) uses the raw residual produced by subtracter 112 to determine a relatively optimum data length of least significant binary portion 504 such that encoding of the raw residual would be particularly efficient. Specifically, code length adapter 106 (FIG. 1), which is shown in greater detail in FIG. 3, includes a code length generator 306. Code length generator 306 produces a code length from a filtered residual received from an infinite impulse response (IIR) filter 304. IIR filter 304, in this illustrative embodiment, is a two-tap IIR filter in which the magnitude of the previous filtered residual is weighted and accumulated with a weighted current raw residual. The magnitude of the previous filtered residual is produced by an absolute value filter 302 and is measured by determining the absolute value of the value of the previous filtered residual.

IIR filter 304 has the property that the relative weight of any raw residual magnitude incorporated in IIR filter 304 is directly related to the recency of the raw residual. In other words, the most recently incorporated raw residual magnitude has the highest weight relative to other raw residual magnitudes incorporated in IIR filter 304, the next most recently incorporated raw residual magnitude has the next highest relative weight, and so on. By comparison, a straight average of a number of recent raw residuals gives equal weight to each residual regardless of the recency of each of the raw residuals. IIR filter 304 has an additional advantage of simple implementation; as new raw residual magnitudes are incorporated into IIR filter 304, the influence of earlier raw residual magnitudes upon IIR filter 304 decrease. Accordingly, IIR filter 304 remains effective throughout lossless compression of an entire digitized audio signal without requiring explicit clearing of influence of increasingly remote raw residual magnitudes.

In an embodiment which executes particularly efficiently, the weight attributed to the previous filtered residual magnitude is $(2^j-1)/2^j$ and the weight attributed to the current raw residual magnitude is $\frac{1}{2^j}$ where j is an integer. Accordingly, the previous filtered residual magnitude is weighted by bit-shifting the previous filtered residual magnitude to the left j positions to thereby multiply the previous filtered residual magnitude by $2^j$ and the previous filtered residual magnitude is subtracted from the product to form a product of the previous filtered residual magnitude by $2^j-1$. IIR filter 304 accumulates the product with current raw residual magnitude and right-shifts the sum by j positions to effectively divide the sum by $2^j$. Thus, IIR filter 304 produces a filtered residual magnitude from the previous filtered residual magnitude and the current raw residual magnitude using only four (4) integer operations. IIR filter 304 therefore executes with great efficiency.

Code length generator 306 determines the length of least significant binary portion 508 (FIG. 5C) from the filtered residual magnitude. Specifically, code length generator 306 (FIG. 3) determines the minimum k such that $2^k$ is greater than or equal to the filtered residual magnitude. IIR filter 304 serves as a particularly good predictor for the amount of data required to represent the current raw residual, especially for lossless compression of digitized sound. IIR filter 304 emphasizes recent raw residual magnitudes while less recent raw residual magnitudes have less emphasis in the filtered residual. At the same time, IIR filter 304 is particularly simple and executes particularly efficiently.

Clamped Residuals

Figure 4:
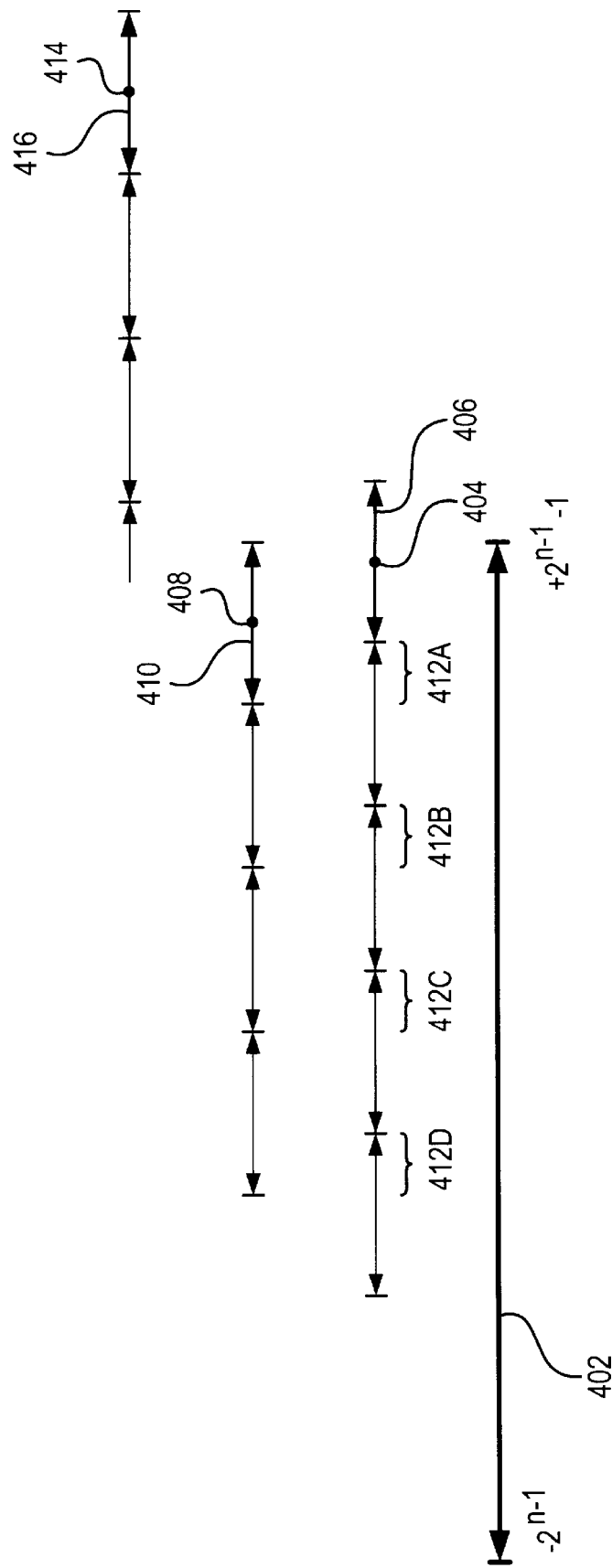
FIG. 4 is a number line diagram illustrating the clamping of predicted samples produced by the predictor of FIG. 2.

Coder 110 does not encode raw residuals from subtracter 112. Instead, coder 110 encodes clamped residuals from subtracter 114. Subtracter 114 measures a clamped residual as a difference between the current source sample and a clamped predicted sample received from clamp 108. Clamp 108 limits the predicted sample produced by predictor 102 and received from delay 104 to within a limited range of predicted samples. FIG. 4 is illustrative.

FIG. 4 shows a range 402 of valid sample values that can be represented by n bits. It should be noted that a binary word having n bits can represent a limited range of values. Any predicted value outside of that limited range, as represented by range 402, cannot possibly be the actual value of the current sample since the current sample is inherently limited to the values within range 402. Clamp 108 prevents consideration of predicted values outside of range 402 and improves compression rates as a result.

Assume for this illustrative example that predictor 102 (FIG. 1) produces a predicted sample 404 (FIG. 4) whose value is very near or at the maximum value that can be represented using n bits. Range 406 represents the range of source sample values that can be represented by a residual using only least significant binary portion 508 (FIG. 5C) of a Golomb-Rice encoded residual. A portion of range 406 (FIG. 4) extends beyond the maximum value of range 402. That portion of range 406 is wasted since no valid source sample can have a value outside of range 402. This waste is more clearly illustrated by comparison to a clamped predicted sample 408.

Clamped predicted sample 408 is limited to a maximum value which is less than the maximum of range 402 by the non-negative range of least significant binary portion 508 (FIG. 5C), i.e., by the maximum amount by which least significant binary portion 508 can increase a predicted sample. Accordingly, range 410 (FIG. 4), which represents the range of source sample values that can be represented by a residual using only least significant binary portion 508 (FIG. 5C) of a Golomb-Rice encoded residual based on clamped predicted sample 408 (FIG. 4), extends up to but not beyond the maximum value of range 402. If the value of the current source sample is within range 412A, encoding the residual from predicted sample 404 requires two (2) bits for most significant unary portion 506 (FIG. 5C) in addition to k bits for least significant binary portion 504. By comparison, the current source sample within range 412A (FIG. 4) can be encoded from a residual from clamped predicted sample 408 using only one (1) bit for most significant unary portion 506 (FIG. 5C). Thus, for some source samples, a bit is saved by clamping the predicted sample.

Such savings are further realized for other source samples, e.g., source samples in ranges 412B–D. In range 412B, predicted sample 404 requires three (3) bits for most significant unary portion 506 (FIG. 5C) while clamped predicted sample 408 (FIG. 4) requires two (2) bits for most significant unary portion 506 (FIG. 5C). In range 412C (FIG. 4), predicted sample 404 requires four (4) bits for most significant unary portion 506 (FIG. 5C) while clamped predicted sample 408 (FIG. 4) requires three (3) bits for most significant unary portion 506 (FIG. 5C). In range 412D (FIG. 4), predicted sample 404 requires five (5) bits for most significant unary portion 506 (FIG. 5C) while clamped predicted sample 408 (FIG. 4) requires four (4) bits for most significant unary portion 506 (FIG. 5C).

Predictor 102 (FIG. 1) can produce a predicted sample, e.g., predicted sample 414 (FIG. 4), which is well beyond range 402. While predictor 102 is designed to predict source samples with particular accuracy, such sample prediction cannot be perfect and anomalous predictions well outside range 402 are possible. In this illustrative example, at least four (4) bits for most significant unary portion 506 (FIG. 5C) are required to represent a residual from predicted sample 414 (FIG. 4) which corresponds to a source sample which is necessarily within range 402. Clamp 108 (FIG. 1) limits all predicted samples to no more than clamped predicted sample 408 (FIG. 4).

Clamp 108 (FIG. 1) realizes analogous benefits at the other end of range 402 (FIG. 4) by limiting predicted samples to a minimum clamped predicted sample. Specifically, the minimum clamped predicted sample is limited to a minimum value which is greater than the minimum of range 402 by the non-positive range of least significant binary portion 508 (FIG. 5C), i.e., by the maximum amount by which least significant binary portion 504 can decrease a predicted sample. To determine the maximum and minimum clamped predicted samples, clamp 108 (FIG.

1) receives the code length, k, from code length adapter 106. In this illustrative embodiment, the maximum and minimum clamped predicted samples are $2^{n-1}-\frac{1}{2}(2^k)-1$ and $-2^{n-1}+\frac{1}{2}(2^k)$, respectively.

Subtracter 114 receives the current source sample and, from clamp 108, the clamped predicted sample and measures as a difference therebetween a clamped residual. Coder 110 receives the code length from code length adapter 106 and the clamped residual from subtracter 114 and encodes the clamped residual as described above with least significant binary portion 504 (FIG. 5) having a data length defined by the received code length.

Adaptation of the Adaptation Rate

To compress a digitized signal, e.g., a digitized sound signal, using lossless compressor 100 (FIG. 1), each of the individual digital samples of the digitized signal are encoded by lossless compressor 100 in the manner described above. As described above, the aggressiveness with which predictor 102 (FIG. 2) adapts to prediction errors in the form of raw residuals is controlled by adaptation rate 208. Specifically, predictor coefficient adapter 206 (FIG. 11) uses adaptation rate 208 to weight the product of the raw residual and previous source sample 1102 (FIG. 11) as stored in delay buffer 202, which represents an error in the prediction of the current sample attributable to previous source sample 1102, prior to adjusting filter coefficient 1104 using the weighted product. It is quite difficult to select an adaptation rate which produces good compression rates for an entire digitized signal. For example, digitized music frequently has soft, quiet passages as well as much more dynamic passages. With such a signal, a lower adaptation rate produces better results for the quiet passages while a higher adaptation rate produces better results for the more dynamic passages. Therefore, adaption rate 208 is periodically adapted.

In encoding an entire signal, e.g., a digitized audio signal such as a musical composition, each of a multitude of individual digital samples are encoded by lossless compressor 100 (FIG. 1) and transmitted in encoded form to a lossless decompressor 700 (FIG. 7) which decodes the encoded samples to recreate the original digital samples of the entire signal and which is described more completely below. To periodically adapt adaptation rate 208 (FIG. 2), the individual digital samples are encoded in blocks of a predetermined size. In one embodiment, a block includes 2048 digital samples. Of course, larger or smaller block sizes can be used to adapt adaptation rate 208 less or more frequently, respectively. In sending each block of samples to lossless decompressor 700 (FIG. 7), a block header is included. Accordingly, using smaller block sizes also increases data transmission overhead. If adaptation rate 208 (FIG. 2) does not change for several blocks, a larger block size can be used to reduce data transmission overhead. Conversely, using smaller blocks allows lossless compressor 100 (FIG. 1) to adjust adaptation rate 208 (FIG. 2) more frequently to thereby achieve better compression rates. If adaptation rate 208 changes frequently and by more than a minimum increment, a smaller block size can allow adaptation rate 208 to adapt more immediately to changes in the character of the digital signal and achieve improved compression rates notwithstanding dynamic qualities of the digital signal.

Figure 6:
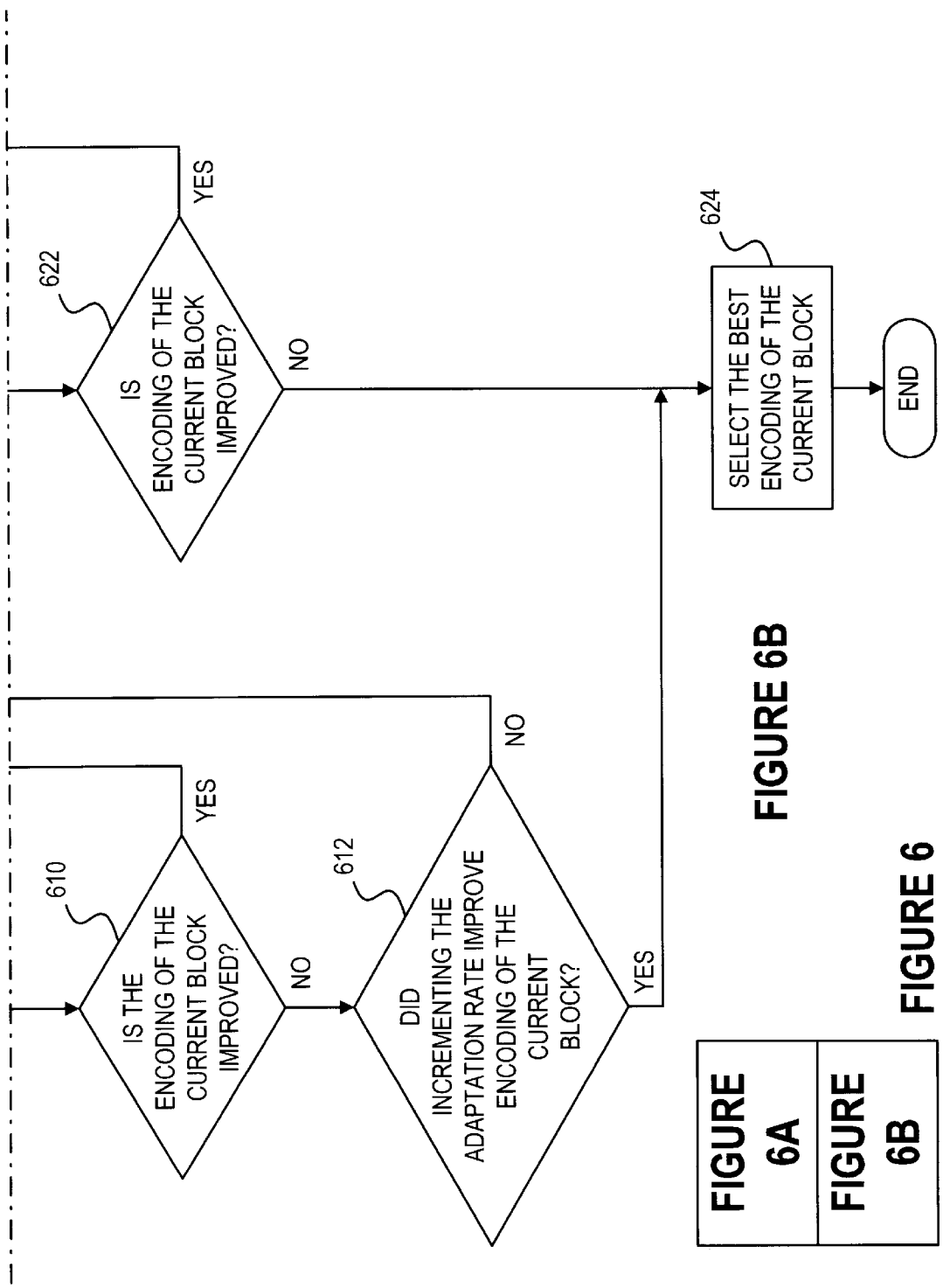
FIG. 6 is a logic flow diagram of the adaptation of the adaptation rate of the predictor of FIG. 2.
Figure 7:
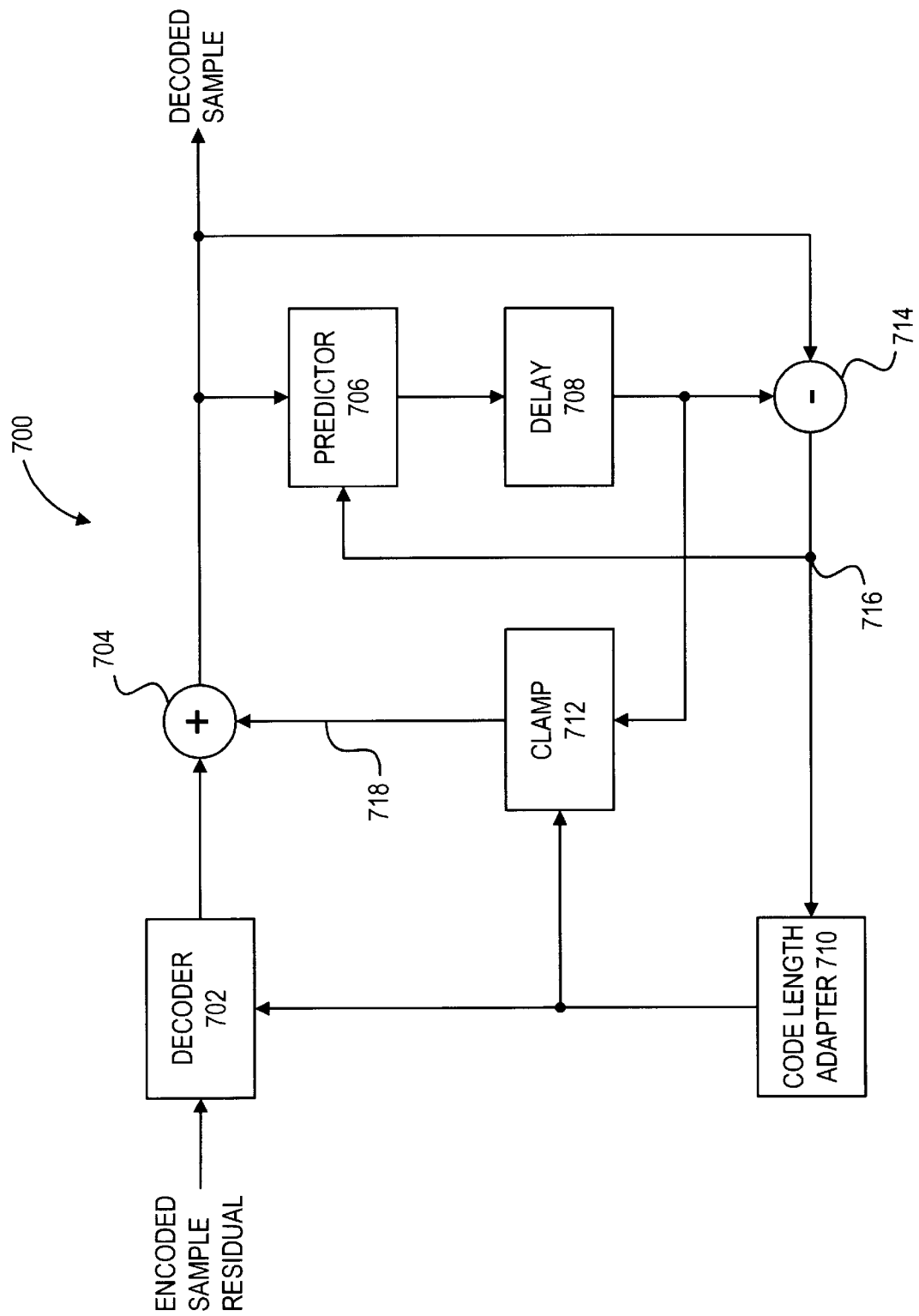
FIG. 7 is a block diagram of a lossless decompressor in accordance with the present invention.

The block header includes data specifying (i) the adaptation rate used by predictor 102, i.e., adaptation rate 208, (ii) the number of samples in the block, (iii) the total number of bits of the block, (iv) whether the samples of the block are compressed or are in their native, uncompressed form, (v) whether the block includes data specifying a new state for lossless decompressor 700 (FIG. 7). For each block encoded by lossless compressor 100 (FIG. 1), adaptation rate 208 (FIG. 2) is adapted according to logic flow diagram 600 (FIG. 6).

Figure 2:
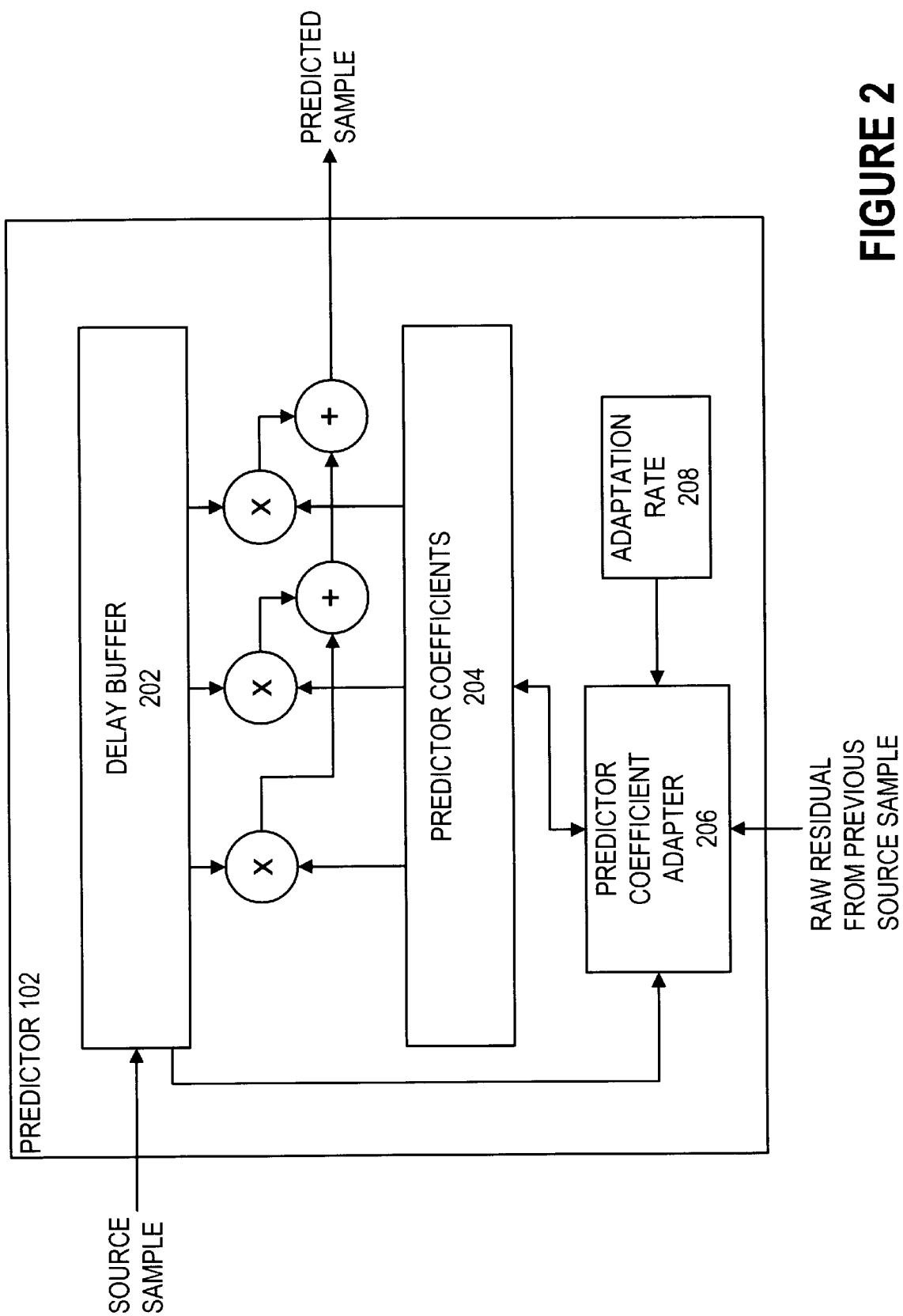
FIG. 2 is a block diagram of a predictor of the lossless compressor of FIG. 1.

Processing according to logic flow diagram 600 begins with step 602 in which the adaptation rate used in compressing the previous block is selected and stored as adaptation rate 208 (FIG. 2). During a particular performance of the steps of logic flow diagram 600 (FIG. 6), the adaptation rate used in compressing the previous block is referred to as the original adaptation rate. Processing transfers to step 604 in which the current block is encoded using adaptation rate 208 (FIG. 2) as set in step 602 (FIG. 6).

In step 606, lossless compressor 100 (FIG. 1) increments adaptation rate 208 (FIG. 11). It should be noted that, in this illustrative embodiment, adaptation rate 208 represents an exponent since multiplier 1106 effects multiplication using left bit-wise shifting by a number of bit-places represented by adaptation rate 208. Accordingly, incrementing adaptation rate 208 in this embodiment effectively doubles the rate at which predictor coefficients are adapted in response to raw residuals. Lossless compressor 100 (FIG. 1) encodes the current block using adaptation rate 208 (FIG. 2) as incremented in step 606 (FIG. 6). Processing transfers from step 606 to test step 610. In test step 610, lossless compressor 100 (FIG. 1) determines whether the most recent encoding of the current block is improved, i.e., more compact, than the previously best encoding of the current block. If so, processing transfers to step 606 in which adaptation rate 208 (FIG. 2) is again incremented and, therethrough, to step 608 (FIG. 6) in which the current block is again encoded. Conversely, if the mot recent encoding of the current block is not an improvement, processing transfers from test step 610 (FIG. 6) to test step 612.

In test step 612, lossless compressor 100 (FIG. 1) determines whether incrementing adaptation rate 208 (FIG. 2) improved encoding of the current block in relation to encoding of the current block using the original adaptation rate. If so, lossless compressor 100 (FIG. 1) does not try decrementing adaptation rate 208 (FIG. 2) from the original adaptation rate in steps 614–622 as described below. Instead, processing transfers directly to step 624 in which lossless compressor 100 (FIG. 1) selects the best, i.e., most compact, encoding of the current block and the corresponding adaptation rate. Conversely, if incrementing adaptation rate 208 (FIG. 2) did not improve encoding of the current block in relation to encoding of the current block using the original adaptation rate, lossless compressor 100 (FIG. 1) attempts improvement of encoding of the current block by decrementing adaptation rate 208 (FIG. 2) in steps 614–622 (FIG. 6).

In step 614, lossless compressor 100 (FIG. 1) resets adaptation rate 208 (FIG. 2) to the original adaptation rate. Lossless compressor 100 (FIG. 1), in step 616 (FIG. 6), encodes the current block using adaptation rate 208 (FIG. 2) as set in step 614 (FIG. 6).

In step 618, lossless compressor 100 (FIG. 1) decrements adaptation rate 208 (FIG. 2). Lossless compressor 100 (FIG. 1), in step 620 (FIG. 6), encodes the current block using adaptation rate 208 (FIG. 2) as decremented in step 618 (FIG. 6). Again, it should be noted that, in this illustrative embodiment, adaptation rate 208 represents an exponent and multiplier 1106 effects multiplication using left bit-wise shifting by a number of bit-places represented by adaptation rate 208. Accordingly, decrementing adaptation rate 208 in this embodiment effectively halves the rate at which predictor coefficients are adapted in response to raw residuals.

Processing transfers from step 620 to test step 622. In test step 622, lossless compressor 100 (FIG. 1) determines whether the most recently encoding of the current block is improved, i.e., more compact, than the previously best encoding of the current block. If so, processing transfers to step 618 (FIG. 6) in which adaptation rate 208 (FIG. 2) is again decremented and, therethrough, to step 620 (FIG. 6) in which the current block is again encoded. Conversely, if the mot recent encoding of the current block is not an improvement, processing transfers from test step 622 (FIG. 6) to test step 624. As described above, lossless compressor 100 (FIG. 1) selects the best, i.e., most compact, encoding of the current block and the corresponding adaptation rate in step 624 (FIG. 6).

Thus, in accordance with logic flow diagram 600, lossless compressor 100 (FIG. 1) periodically adjusts adaptation rate 208 (FIG. 2) to optimize compression of individual blocks of the digital signal. As described above, incremental changes in adaptation rate 208 effectively double or half the rate at which predictor coefficients 204 adapt in accordance with a raw residual. Accordingly, an optimum adaptation rate is achieved with few adjustments to adaptation rate 208. Since each adjustment of adaptation rate 208 requires another iterative lossless compression of samples of a particular block, reducing the number of adjustments to adaptation rate 208 significantly reduces the amount of processing required to optimize adaptation rate 208. In addition, since small changes in adaptation rate 208 result in large changes in the adaptation of predictor coefficients 204, adaptation rate 208 changes only in response to significant changes in the signal characteristics of the digitized audio signal processed by lossless compressor 100 (FIG. 1). In other words, adaptation rate 208 is relatively stable and larger block sizes can be used to reduce encoded signal overhead without incurring a penalty in compression rate.

Decompression

A lossless decompressor 700 (FIG. 7) receives encoded sample residuals from lossless compressor 100 and reconstructs digital samples of the digital signal therefrom. Such encoded sample residuals from lossless compressor 100 are typically stored in a computer memory medium for archival purposes and/or transmitted over computer communications media prior to receipt by lossless decompressor 700.

Lossless decompressor 700 includes a decoder 702 which receives the encoded sample residuals and decodes the encoded sample residual to produce a residual signal. Decoder 702 applies the inverse of the encoding applied by coder 110 as described above such that the decoded residual signal is equivalent to the clamped residual described above. Specifically, decoder 702 translates a unary representation of most significant portion 506 (FIG. 5C) to a binary representation which is then combined with binary least significant portion 508 to thereby form data word 502B. Using the illustrative example given above in which k is equal to five (5), decoder 702 (FIG. 7) interprets the first five (5) bits, e.g., "1 1101," as a binary representation of least significant binary portion 508 (FIG. 5C). Following the first five (5) bits is a unary representation of most significant unary portion 506. As described above, coder 110 (FIG. 1) represents this as two (2) "1" bits delimited by a "0" bits. Accordingly, decoder 702 (FIG. 7) decodes most significant unary portion 506 (FIG. 5C) as "0000 0000 010." Combining most significant unary portion 506 with least significant binary portion 508, decoder 702 (FIG. 7) reconstructs the residual signal, "0000 0000 0101 1101."

In addition, decoder 702 restores signed data word 502A (FIG. 5A) from unsigned data word 502B (FIGS. 5B–C). Specifically, decoder 702 (FIG. 7) retrieves and saves sign bit 504 (FIG. 5B) and bit-shifts data word 502B to the right by one bit position. If sign bit 504 indicates a negative value, decoder 702 (FIG. 7) negates the bit-shifted value to form data word 502A (FIG. 5A). Conversely, if sign bit 504 indicates a non-negative value, decoder 702 (FIG. 7) stores the bit-shifted value without negation as data word 502A (FIG. 5A).

Decoder 702 uses an adapted code length received from a code length adapter 710, which adjusts the Golomb-Rice encoding parameter k in response to a reconstructed raw residual signal in the manner that code length adapter 106 (FIG. 1) adjusts the Golomb-Rice encoding parameter k in response to the raw residual as described above. The reconstructed residual signal produced by decoder 702 corresponds to the clamped residual produced by subtracter 114 (FIG. 1) and therefore can differ from the raw residual signal used by code length adapter 106 (FIG. 1) to determine the code length. Accordingly, code length adapter 710 (FIG. 7) determines the code length as represented by encoding parameter k from a reconstructed raw residual signal produced at node 716 by a subtracter 714 in a manner described more completely below.

Decoder 702 (FIG. 7) provides the decoded residual signal to an adder 704 which combines the decoded residual signal with a predicted sample signal. Since the residual encoded by coder 110 (FIG. 1) was clamped by clamp 108, the reconstructed residual signal produced by decoder 702 (FIG. 7) should be similarly combined with a clamped predicted sample signal. A predictor 706 produces the predicted sample signal from a reconstructed sample signal from adder 704 and stores the reconstructed sample signal in a delay 708. Predictor 706 uses the same logic used by predictor 102 (FIG. 1) to make identical predictions with respect to next samples as are made by predictor 102 in forming encoded sample residuals decompressed by lossless decompressor 700 (FIG. 7). Predictor 706 receives the reconstructed residual signal from decoder 702 and adapts in the manner that predictor 102 (FIG. 2) adapts in response to the raw residual as described above. To do so, predictor 706 receives the reconstructed raw residual from node 716. In addition, lossless decompressor 700 periodically receives header information from lossless compressor 100 which can include a new adaptation rate analogous to adaptation rate 208 (FIG. 2). Thus, predictor 706 (FIG. 7) predicts sample signals in a manner which is directly analogous to, and consistent with, predictor 102 (FIG. 1) to ensure accurate reconstruction of the encoded and compressed samples.

The difference between the previously predicted sample signal stored in delay 708 and a currently reconstructed sample is measured by a subtracter 714 and produced at node 716. As described above, the reconstructed raw residual signal from node 716 is used by predictor 706 to adapt in the manner described above with respect to predictor 102 and is used by code length adapter 710 (FIG. 7) to adapt the code length in the manner described above with respect to code length adapter 106 (FIG. 1).

The predicted sample signal stored in delay 708 is received by a clamp 712 which clamps the predicted sample signal in the manner described above with respect to clamp 108 (FIG. 1) to produce a clamped predicted sample at 718 (FIG. 7). Accordingly, the clamped predicted sample at 718 is equivalent to the clamped predicted sample received by subtracter 114 (FIG. 1) immediately prior to encoding by coder 110. Accordingly, combination of the clamped predicted sample signal at 718 with the decoded residual signal at adder 704 faithfully reconstructs the sample compressed by lossless compressor 100 (FIG. 1).

Improved Prediction in Multi-Channel Audio Signals

Figure 8:
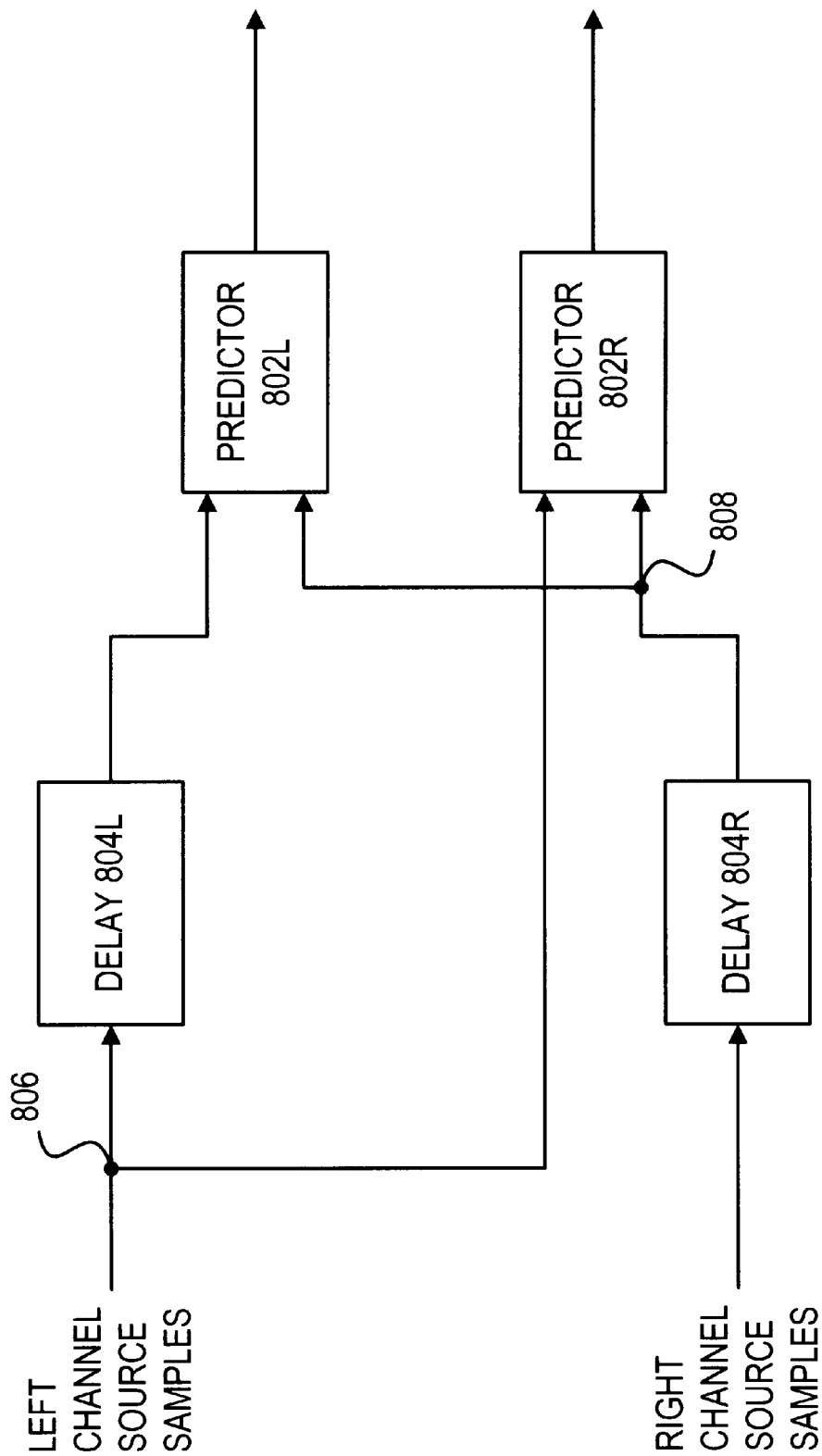
FIG. 8 is a block diagram of left and right predictors for lossless compression in accordance with the present invention.

As described above, better compression rates are realized by lossless compressor 100 when predictor 102 more accurately predicts the next source sample. A source sample can be more accurately predicted using, in addition to previous samples, corresponding samples of a companion digital signal. For example, in a digitized audio signal which is stereo and therefore divided into left and right channels of corresponding samples, there is a high degree of correlation between corresponding samples of the left and right channels. Accordingly, a current sample of one of the companion channels is used to predict a corresponding current sample of another of the companion channels to more accurately predict the corresponding current sample. FIG. 8 is illustrative.

FIG. 8 shows predictors 802L and 802R for left and right channels, respectively, of a digitized stereo audio signal. The left and right channels are companion channels in that the content of the left and right channels are each components of a single, synchronized presentation. Specifically, the left and right channels are intended for synchronized, simultaneous playback as a single audio presentation. As a result, a given sample of the left channel audio signal is a relatively good predictor of a corresponding sample of the right channel audio signal.

Figure 9A:
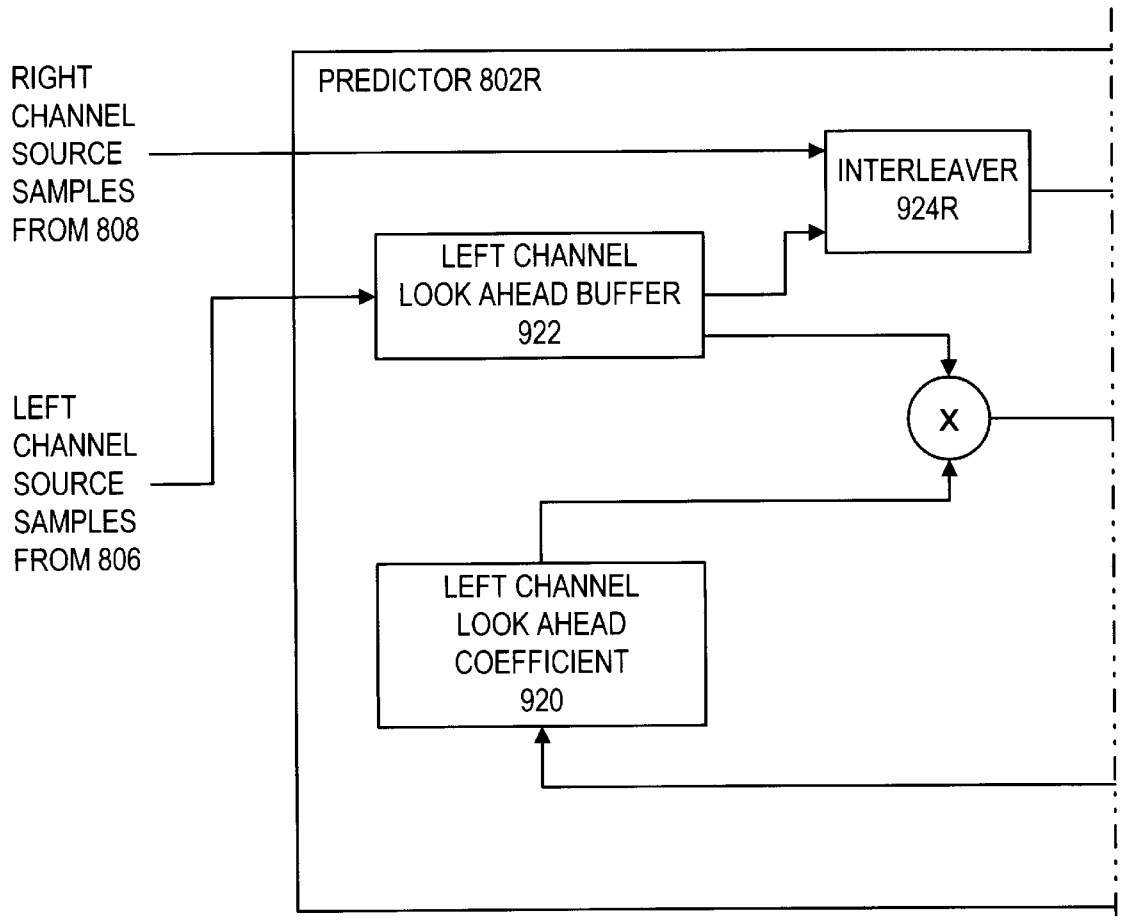
FIGS. 9A–B are block diagrams of the right and left predictors, respectively, of FIG. 8 in greater detail.
Figure 9A:
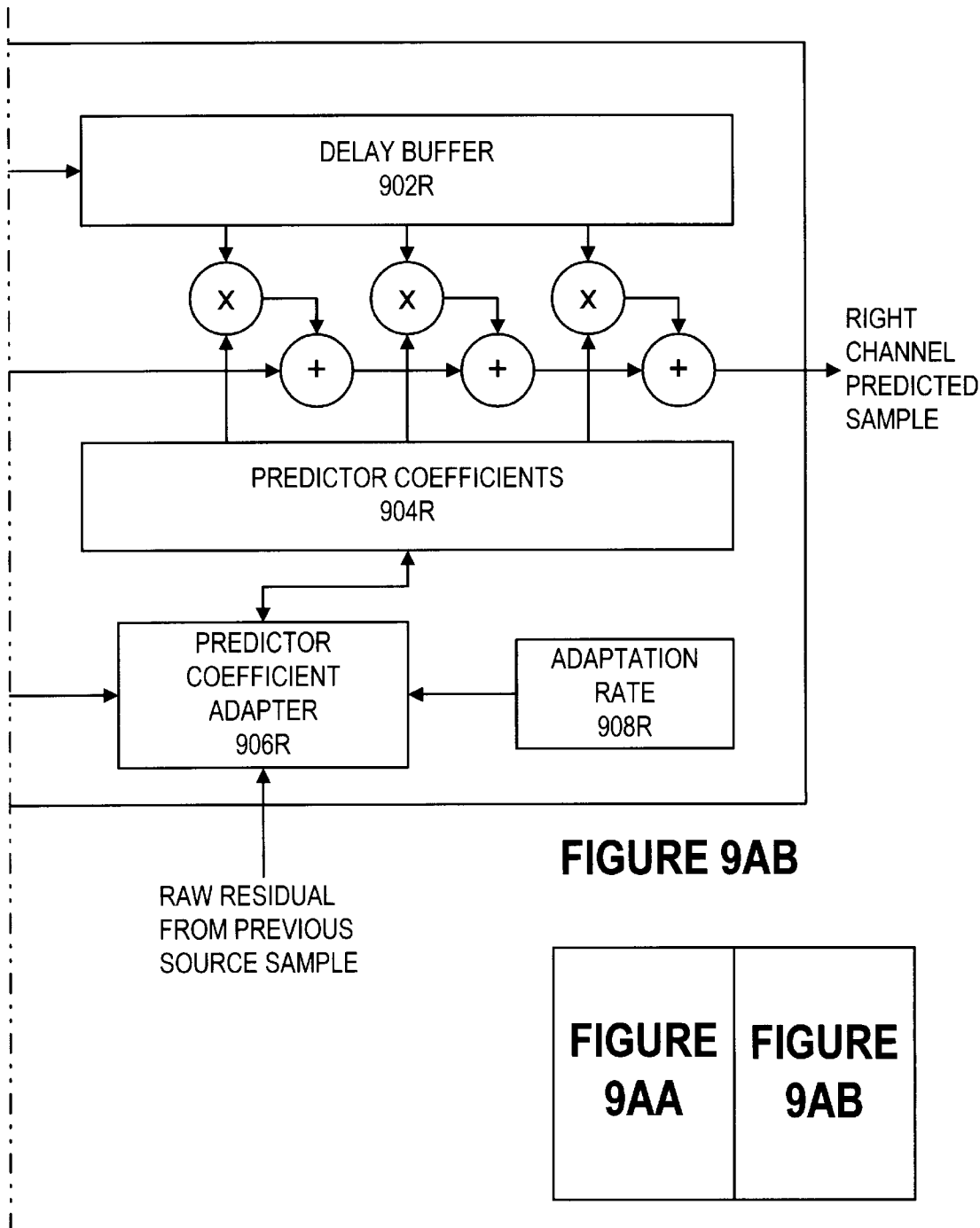
Figure 9B:
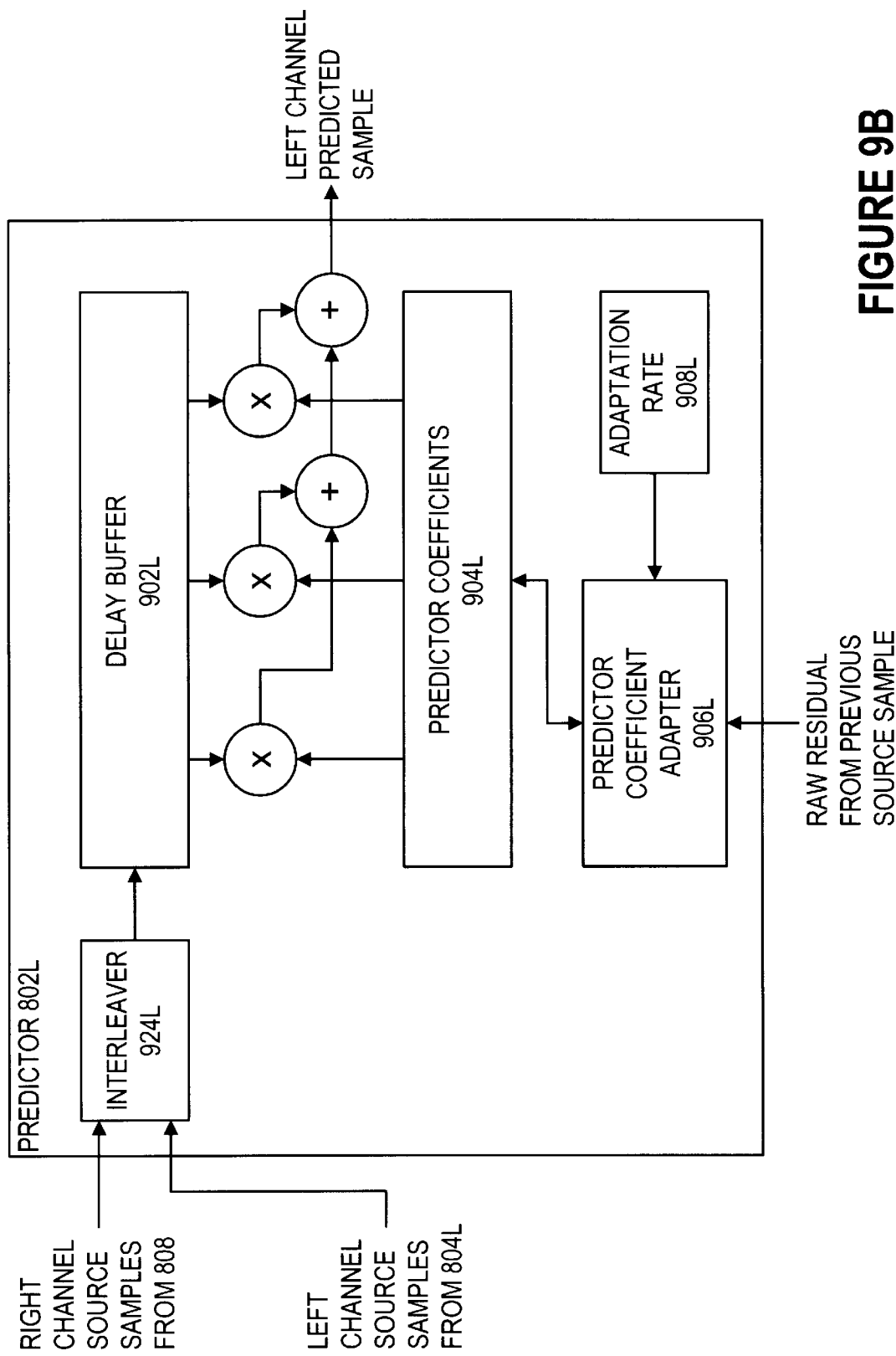

Predictor 802L receives a current sample of the left channel audio signal and produces a predicted next sample of the left channel audio signal in a manner which is analogous to that described above with respect to predictor 102 (FIG. 1). In addition to the current sample of the left channel audio signal, predictor 802L (FIG. 8) also uses the current sample of the right channel audio signal and previously received samples of the left and right channel audio signals. For example, in this illustrative embodiment, predictor 802L applies a least mean square adaptive linear filter to these current and previously received samples of the left and right channel audio signals to predict the next sample of the left channel audio signal. Predictor 802L is described below in greater detail in the context of FIG. 9B.

Predictor 802R (FIG. 8) receives a current sample from the right channel audio signal and a look ahead sample of the left audio channel. The look ahead sample of the left audio channel corresponds to the next sample of the right channel to be subsequently processed by predictor 802R. After a single delay, e.g., a delay provided by left channel look ahead buffer 922 (FIG. 9A), the look ahead sample of the left audio channel becomes a current sample of the left audio channel. Predictor 802R (FIG. 8) uses the current and previously received samples of the left and right channel audio signals and the look ahead sample of the left channel audio signal in a linear, least mean square, adaptive filter, in one embodiment, to predict the next sample of the right channel audio signal. Thus, the look ahead sample of the left channel audio signal is used to predict a corresponding next sample of the right channel audio signal. Predictor 802R is shown in greater detail in FIG. 9A.

Predictor 802R includes delay buffer 902R, predictor coefficients 904R, predictor coefficient adapter 906R, and adaptation rate 908R which are directly analogous to delay buffer 202 (FIG. 2), predictor coefficients 204, predictor coefficient adapter 206, and adaptation rate 208, respectively, of predictor 102. Predictor 802R (FIG. 9) weights a left channel look ahead sample stored in left channel look ahead buffer 922 using a left channel coefficient 920. Predictor 802R combines the weighted left channel look ahead sample with current and previous left and right samples stored in delay buffer 902R as weighted according to adapted predictor coefficients 904R to form a right channel predicted sample. Interleaver 924R interleaves left and right samples of the left and right channels, respectively, into the single delay buffer 902R. In one embodiment, left channel coefficient 920 is adaptive using adaptation rate 908 or, alternatively, an independent adaptation rate, in the manner described above with respect to adaptation rate 208 (FIG. 11).

Predictor 802L (FIG. 9B) includes delay buffer 902L, predictor coefficients 904L, predictor coefficient adapter 906L, adaptation rate 908L, and interleaver 924L which are directly analogous to delay buffer 902R (FIG. 9A), predictor coefficients 904R, predictor coefficient adapter 906R, adaptation rate 908R, and interleaver 924R, respectively, of predictor 802R. Predictor 802L (FIG. 9B) combines current and previous left and right samples stored in delay buffer 902L as weighted according to adapted predictor coefficients 904L to form a left channel predicted sample. Interleaver 924L interleaves left and right samples of the left and right channels, respectively, into the single delay buffer 902L.

Since the samples of the left and right channels are relatively closely related as described above, the right channel predicted sample produced by predictor 80R (FIG. 9A) benefits from a look ahead sample of the left audio channel and more accurately predicts the next right channel sample. Accordingly, any residual between the right channel predicted sample and the next right channel sample is reduced. In addition, fewer bits can be used to represent such a residual and better compression rates are realized.

Figure 10:
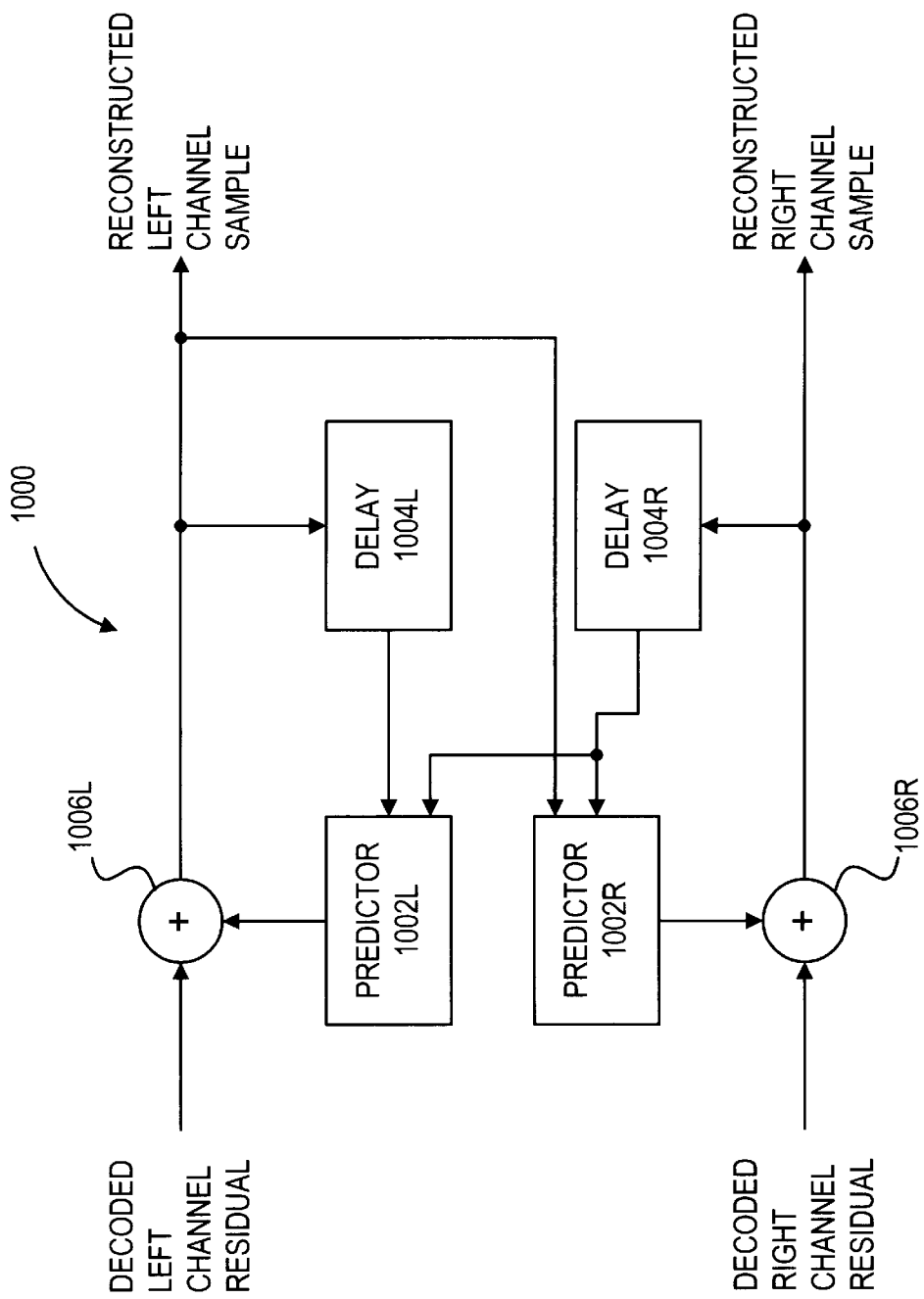
FIG. 10 is a block diagram of left and right predictors for lossless decompression in accordance with the present invention.

FIG. 10 shows a portion of a stereo decompressor 1000 in accordance with the present invention. Stereo decompressor 1000 includes a left channel, which includes a predictor 1002L, a delay 1004L, and an adder 1006L, and a right channel, which includes a predictor 1002R, a delay 1004R, and an adder 1006R. Predictor 1002L receives a previously reconstructed left channel sample from delay 1004L and a previously reconstructed right channel sample from delay 1004R and predicts a current left channel sample in generally the manner described above with respect to predictor 802L (FIGS. 8 and 9B). Adder 1006L (FIG. 10) combines the predicted current left channel sample with a decoded left channel residual to reconstruct a current left channel sample.

Predictor 1002R receive a previously reconstructed right channel sample from delay 1004R and receives the current reconstructed left channel sample from adder 1006L. Predictor 1002R uses the previously reconstructed right channel sample and the current reconstructed left channel sample to predict a current right channel sample in the manner described above with respect to predictor 802R (FIGS. 8 and 9A). Since predictor 1002R (FIG. 10) requires the current reconstructed left channel sample produced from adder 1006L, execution of predictor 1002R is subsequent to predictor 1002L. Adder 1006R combines the predicted current right channel sample with a decoded right channel residual to reconstruct a current right channel sample.

Thus, in a digitized audio signal with multiple channels, an actual sample from one channel is used to more accurately predict a corresponding sample of another channel. This concept can be used in digitized audio signals with more than two channels, e.g., quadraphonic audio signals. For example, an actual sample from the left front channel is used in the prediction of corresponding samples of the right front, right rear, and left rear channels. In addition, an actual sample of the right front channel is used in the prediction of corresponding samples of the right rear and left rear channels. Furthermore, an actual sample of the left rear channel is used in the prediction of a corresponding sample of the right rear channel. In other words, (i) predicting a sample of the right front channel has the benefit of an actual corresponding sample of the left front channel, (ii) predicting a sample of the left rear channel has the benefit of actual corresponding samples of the left front and right front channels, and (iii) predicting a sample of the right rear channel has the benefit of actual corresponding samples of the left front, right front, and left rear channels. Accordingly, the corresponding samples of a multiple channel digitized audio signal are predicted with significantly improved accuracy and are compressed with a commensurately improved compression rate.

Inclusion of Lossless Compressor 100 in a Computer System

In general, lossless compressor 100 (FIG. 1) compresses signals such as digitized audio signals for such purposes as archival storage or for transmission through a computer network. Lossless compressor 100 executes within a computer system 1200 (FIG. 12) as described more completely below. In addition, lossless decompressor 700 (FIG. 7) also executes within computer system 1200 (FIG. 12) to restore the compressed signal to its original form. As shown in FIG. 12, lossless compressor 100 and lossless decompressor 700 both execute within the same computer system. Such would be appropriate if lossless compressor 100 is used to store the signal, e.g., source signal 1240, in a compressed form for archival purposes. However, lossless decompressor 700 can also execute in a remote computer system (not shown) which is coupled to computer system 1200 through a computer network 1280 such that lossless decompressor 700 can restore source signal 1240 as reconstructed source signal 1240B from encoded signal 1250 after receiving encoded signal 1250 through computer network 1280. Lossless compressor 100 and lossless decompressor 700 execute sufficiently efficiently that such compression and decompression can be accomplished by lossless compressor 100 and lossless decompressor 700, respectively, during real-time streaming of source signal 1240, in the form of a compressed encoded signal 1250, through computer network 1280.

Computer system 1200 includes a processor 1202 and memory 1204 which is coupled to processor 1202 through an interconnect 1206. Interconnect 1006 can be generally any interconnect mechanism for computer system components and can be, e.g., a bus, a crossbar, a mesh, a torus, or a hypercube. Processor 1202 fetches from memory 1204 computer instructions and executes the fetched computer instructions. In addition, processor 1202 can fetch computer instructions through computer network 1280 through network access circuitry 1260 such as a modem or ethernet network access circuitry. Processor 1202 also reads data from and writes data to memory 1204 and sends data and control signals through interconnect 1206 to one or more computer display devices 1220 and receives data and control signals through interconnect 1206 from one or more computer user input devices 1230 in accordance with fetched and executed computer instructions.

Memory 1204 can include any type of computer memory and can include, without linitation, randomly accessible memory (RAM), read-only memory (ROM), and storage devices which include storage media such as magnetic and/or optical disks. Memory 1204 includes lossless compressor 100 and lossless decompressor 700 which are each all or part of one or more computer processes which in turn execute within processor 1202 from memory 1204. A computer process is generally a collection of computer instructions and data which collectively define a task performed by computer system 1200. Memory 1204 also includes, in this illustrative embodiment, source signal 1240, encoded signal 1250, and reconstructed source signal 1240B.

Each of computer display devices 1220 can be any type of computer display device including without limitation a printer, a cathode ray tube (CRT), a light-emitting diode LED) display, or a liquid crystal display (LCD). Each of computer display devices 1220 receives from processor 1202 control signals and data and, in response to such control signals, displays the received data. Computer display devices 1220, and the control thereof by processor 1202, are conventional.

Each of user input devices 1230 can be any type of user input device including, without limitation, a keyboard, a numeric keypad, or a pointing device such as an electronic mouse, trackball, lightpen, touch-sensitive pad, digitizing tablet, thumb wheels, or joystick. Each of user input devices generates signals in response to physical manipulation by a user and transmits those signals through interconnect 1206 to processor 1202.

Computer system 1200 also includes signal acquisition circuitry 1270 which can be, for example, a microphone and sound capture circuitry. Sound captured by signal acquisition circuitry 1270 are stored in a buffer in memory 1204 as source signal 1240. Alternatively, sounds can be captured separately, i.e., by another computer system, and stored in memory 1204 as source signal 1240 for lossless compression and delivery to a remote computer system through computer network 1280 upon request. In addition, source signal 1240 can be generated by processing of processor 1202 or by another computer in response to computer instructions specified by a user of computer system 1200 through physical manipulation of one or more of user input devices 1230 and stored in memory 1204.

As described above, lossless compressor 100 executes within processor 1202 from memory 1204. Specifically, processor 1202 fetches computer instructions from lossless compressor 100 and executes those computer instructions. Processor 1202, in executing lossless compressor 100, reads samples from source signal 1240, processes and encodes those samples in the manner described above, and stores the encoded residuals and packet headers in encoded signal 1250 or can transmit the encoded residuals and packet headers immediately through computer network 1280 to a remote computer system (not shown).

Lossless decompressor 700 is all or part of a computer process executing within processor 1202 from memory 1204. Lossless decompressor 700 receives encoded residuals and packet headers from encoded signal 1250 and reconstructs samples of source signal 1240 and stores the reconstructed samples in reconstructed source signal 1240B. Reconstructed source signal 1240B is equivalent to source signal 1240 and can be used in any manner in which source signal 1240 can be used. For example, if source signal 1240 is an audio signal, reconstructed source signal 1240B is an equivalent audio signal and can be reproduced to present the sound represented by both source signal 1240 and reconstructed source signal 1240B.

The above description is illustrative only and is not limiting. The present invention is limited only by the claims which follow.

What is claimed is:

1. A method for encoding one or more source samples of a digital signal, the method comprising:

receiving a current sample of the one or more source samples;

predicting a predicted current sample using one or more previously received ones of the one or more source samples;

measuring a residual signal between the received current sample and the predicted current sample;

encoding the residual signal by:

partitioning the residual signal into a least significant portion which has a number of bits and a most significant portion;

representing the least significant portion in binary form using the number of bits;

determining a value of the most significant portion;

representing the most significant portion as a series of bits having a first predetermined bit value wherein the series has a length equivalent to the value of the most significant portion and is delimited by a bit having a second predetermined bit value; and adapting the number of bits by:

applying an infinite impulse response filter to the residual signal to form a filtered residual signal; and adjusting the number of bits in accordance with the filtered residual signal.

2. The method of claim 1 wherein the step of applying comprises:

weighting a previous filtered residual signal with a first weight to form a weighted previous filtered residual signal;

combining the residual signal with the weighted previous filtered residual signal to form a combined residual signal; and normalizing the combined residual signal to form the filtered residual signal.

3. The method of claim 2 wherein the step of weighting comprises:

shifting the previous filtered residual signal to the left an integer number of bit places to form a shifted previous filtered residual signal; and subtracting the previous filtered residual signal from the shifted previous filtered residual signal to form the weighted previous filtered residual signal;

further wherein the step of normalizing comprises:

shifting the combined residual signal to the right the integer number of bit places to form the filtered residual signal.

4. A method for decoding one or more source samples of a digital signal, the method comprising:

(a) receiving an encoded residual signal;

(b) decoding the encoded residual signal by:

(i) parsing the encoded residual signal into a least significant portion binary representation which has a number of bits and a most significant portion unary representation;

(ii) deriving a most significant portion value from the most significant portion unary representation; and (iii) concatenating a binary representation of the most significant portion value with the least significant binary representation to form a binary representation of the encoded residual signal;

(c) producing a residual signal in accordance with the binary representation of the encoded residual signal; and (d) adapting the number of bits by:

(i) applying an infinite impulse response filter to the residual signal to form a filtered residual signal; and (ii) adjusting the number of bits in accordance with the filtered residual signal.

5. The method of claim 4 wherein step (c) comprises:

predicting a predicted current sample using one or more previously decoded samples;

combining the binary representation of the encoded residual signals with the predicted current sample to form a decoded current sample; and measuring a difference between the decoded current sample and the predicted current sample; and representing the difference as the residual signal.

6. The method of claim 4 wherein the step of applying comprises:

weighting a previous filtered residual signal with a first weight to form a weighted previous filtered residual signal;

combining the residual signal with the weighted previous filtered residual signal to form a combined residual signal; and normalizing the combined residual signal to form the filtered residual signal.

7. The method of claim 6 wherein the step of weighting comprises:

shifting the previous filtered residual signal to the left an integer number of bit places to form a shifted previous filtered residual signal; and subtracting the previous filtered residual signal from the shifted previous filtered residual signal to form the weighted previous filtered residual signal;

further wherein the step of normalizing comprises:

shifting the combined residual signal to the right the integer number of bit places to form the filtered residual signal.

8. A computer readable medium useful in association with a computer which includes a processor and a memory, the computer readable medium including computer instructions which are configured to cause the computer to encode one or more source samples of a digital signal by performing the steps of:

receiving a current sample of the one or more source samples;

predicting a predicted current sample using one or more previously received ones of the one or more source samples;

measuring a residual signal between the received current sample and the predicted current sample;

encoding the residual signal by:

partitioning the residual signal into a least significant portion which has a number of bits and a most significant portion;

representing the least significant portion in binary form using the number of bits;

determining a value of the most significant portion;

representing the most significant portion as a series of bits having a first predetermined bit value wherein the series has a length equivalent to the value of the most significant portion and is delimited by a bit having a second predetermined bit value; and adapting the number of bits by:

applying an infinite impulse response filter to the residual signal to form a filtered residual signal; and adjusting the number of bits in accordance with the filtered residual signal.

9. The computer readable medium of claim 8 wherein the step of applying comprises:

weighting a previous filtered residual signal with a first weight to form a weighted previous filtered residual signal;

combining the residual signal with the weighted previous filtered residual signal to form a combined residual signal; and normalizing the combined residual signal to form the filtered residual signal.

10. The computer readable medium of claim 9 wherein the step of weighting comprises:
   shifting the previous filtered residual signal to the left an integer number of bit places to form a shifted previous filtered residual signal; and
   subtracting the previous filtered residual signal from the shifted previous filtered residual signal to form the weighted previous filtered residual signal;
   further wherein the step of normalizing comprises:
   shifting the combined residual signal to the right the integer number of bit places to form the filtered residual signal.

11. A computer readable medium useful in association with a computer which includes a processor and a memory, the computer readable medium including computer instructions which are configured to cause the computer to decode one or more source samples of a digital signal by performing the steps of:
   (a) receiving an encoded residual signal;
   (b) decoding the encoded residual signal by:
      (i) parsing the encoded residual signal into a least significant portion binary representation which has a number of bits and a most significant portion unary representation;
      (ii) deriving a most significant portion value from the most significant portion unary representation; and
      (iii) concatenating a binary representation of the most significant portion value with the least significant binary representation to form a binary representation of the encoded residual signal;
   (c) producing a residual signal in accordance with the binary representation of the encoded residual signal; and
   (d) adapting the number of bits by:
      (i) applying an infinite impulse response filter to the residual signal to form a filtered residual signal; and
      (ii) adjusting the number of bits in accordance with the filtered residual signal.

12. The computer readable medium of claim 11 wherein step (c) comprises:
   predicting a predicted current sample using one or more previously decoded samples;
   combining the binary representation of the encoded residual signals with the predicted current sample to form a decoded current sample; and
   measuring a difference between the decoded current sample and the predicted current sample; and
   representing the difference as the residual signal.

13. The computer readable medium of claim 11 wherein the step of applying comprises:
   weighting a previous filtered residual signal with a first weight to form a weighted previous filtered residual signal;
   combining the residual signal with the weighted previous filtered residual signal to form a combined residual signal; and
   normalizing the combined residual signal to form the filtered residual signal.

14. The computer readable medium of claim 13 wherein the step of weighting comprises:
   shifting the previous filtered residual signal to the left an integer number of bit places to form a shifted previous filtered residual signal; and
   subtracting the previous filtered residual signal from the shifted previous filtered residual signal to form the weighted previous filtered residual signal;
   further wherein the step of normalizing comprises:
   shifting the combined residual signal to the right the integer number of bit places to form the filtered residual signal.

15. A computer system comprising:
   a processor;
   a memory operatively coupled to the processor; and
   an encoder which executes in the processor from the memory and which, when executed by the processor, causes the computer to encode one or more source samples of a digital signal by performing the steps of:
   receiving a current sample of the one or more source samples;
   predicting a predicted current sample using one or more previously received ones of the one or more source samples;
   measuring a residual signal between the received current sample and the predicted current sample;
   encoding the residual signal by:
      partitioning the residual signal into a least significant portion which has a number of bits and a most significant portion;
      representing the least significant portion in binary form using the number of bits;
      determining a value of the most significant portion;
      representing the most significant portion as a series of bits having a first predetermined bit value wherein the series has a length equivalent to the value of the most significant portion and is delimited by a bit having a second predetermined bit value; and adapting the number of bits by:
         applying an infinite impulse response filter to the residual signal to form a filtered residual signal; and
         adjusting the number of bits in accordance with the filtered residual signal.

16. The computer system of claim 15 wherein the step of applying comprises:
   weighting a previous filtered residual signal with a first weight to form a weighted previous filtered residual signal;
   combining the residual signal with the weighted previous filtered residual signal to form a combined residual signal; and
   normalizing the combined residual signal to form the filtered residual signal.

17. The computer system of claim 16 wherein the step of weighting comprises:
   shifting the previous filtered residual signal to the left an integer number of bit places to form a shifted previous filtered residual signal; and
   subtracting the previous filtered residual signal from the shifted previous filtered residual signal to form the weighted previous filtered residual signal;
   further wherein the step of normalizing comprises:
   shifting the combined residual signal to the right the integer number of bit places to form the filtered residual signal.

18. A computer system comprising:
   a processor;
   a memory operatively coupled to the processor; and
   a decoder which executes in the processor from the memory and which, when executed by the processor, causes the computer to decode one or more source samples of a digital signal by performing the steps of:
(a) receiving an encoded residual signal;
(b) decoding the encoded residual signal by:
  (i) parsing the encoded residual signal into a least significant portion binary representation which has a number of bits and a most significant portion unary representation;
  (ii) deriving a most significant portion value from the most significant portion unary representation; and
  (iii) concatenating a binary representation of the most significant portion value with the least significant binary representation to form a binary representation of the encoded residual signal;
(c) producing a residual signal in accordance with the binary representation of the encoded residual signal; and
(d) adapting the number of bits by:
  (i) applying an infinite impulse response filter to the residual signal to form a filtered residual signal; and
  (ii) adjusting the number of bits in accordance with the filtered residual signal.

19. The computer system of claim 18 wherein step (c) comprises:
predicting a predicted current sample using one or more previously decoded samples;
combining the binary representation of the encoded residual signals with the predicted current sample to form a decoded current sample; and
measuring a difference between the decoded current sample and the predicted current sample; and
representing the difference as the residual signal.

20. The computer system of claim 18 wherein the step of applying comprises:
weighting a previous filtered residual signal with a first weight to form a weighted previous filtered residual signal;
combining the residual signal with the weighted previous filtered residual signal to form a combined residual signal; and
normalizing the combined residual signal to form the filtered residual signal.

21. The computer system of claim 20 wherein the step of weighting comprises:
shifting the previous filtered residual signal to the left an integer number of bit places to form a shifted previous filtered residual signal; and
subtracting the previous filtered residual signal from the shifted previous filtered residual signal to form the weighted previous filtered residual signal;
further wherein the step of normalizing comprises:
shifting the combined residual signal to the right the integer number of bit places to form the filtered residual signal.

* * * * *